(12) United States Patent
Kurobe

(10) Patent No.: US 12,028,633 B2
(45) Date of Patent: Jul. 2, 2024

(54) IMAGING DEVICE WITH IMPROVED LAYOUT OF READING CIRCUIT TRANSISTORS

(71) Applicant: SONY SEMICONDUCTOR SOLUTIONS CORPORATION, Kanagawa (JP)

(72) Inventor: Toshihiro Kurobe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 252 days.

(21) Appl. No.: 17/438,713

(22) PCT Filed: Mar. 12, 2020

(86) PCT No.: PCT/JP2020/010811
§ 371 (c)(1),
(2) Date: Sep. 13, 2021

(87) PCT Pub. No.: WO2020/203141
PCT Pub. Date: Oct. 8, 2020

(65) Prior Publication Data
US 2022/0150431 A1    May 12, 2022

(30) Foreign Application Priority Data

Mar. 29, 2019 (JP) .................................. 2019-068602

(51) Int. Cl.
*H04N 25/75* (2023.01)
*H01L 27/146* (2006.01)

(52) U.S. Cl.
CPC ....... *H04N 25/75* (2023.01); *H01L 27/14612* (2013.01); *H01L 27/14636* (2013.01)

(58) Field of Classification Search
CPC ........ H04N 25/75; H04N 25/79; H04N 25/76; H01L 27/14612; H01L 27/14636; H01L 27/14634
See application file for complete search history.

(56) References Cited

U.S. PATENT DOCUMENTS

2010/0238331 A1    9/2010   Umebayashi et al.
2018/0054576 A1*   2/2018   Otaka .................... H04N 25/59
(Continued)

FOREIGN PATENT DOCUMENTS

| JP | 2010-245506 | 10/2010 |
| JP | 2018029254 A | 2/2018 |
| JP | 2018-046039 | 3/2018 |

OTHER PUBLICATIONS

International Search Report prepared by the Japan Patent Office dated May 20, 2020, for International Application No. PCT/JP2020/010811, 2 pgs.

*Primary Examiner* — Nicholas G Giles
(74) *Attorney, Agent, or Firm* — SHERIDAN ROSS P.C.

(57) ABSTRACT

An imaging device is provided which allows an increase in the degree of freedom of its layout. The imaging device includes a first semiconductor substrate including a sensor pixel for performing photoelectric conversion, and a second semiconductor substrate including a readout circuit for outputting a pixel signal according to an electric charge output from the sensor pixel. The second semiconductor substrate is laminated on the one surface side of the first semiconductor substrate so as to configure a laminated body. The second semiconductor substrate includes a first surface facing the first semiconductor substrate, and a second surface located opposite to the first surface. The first transistor included in the readout circuit is disposed in the first surface, and the second transistor included in the readout circuit is disposed in the second surface.

20 Claims, 18 Drawing Sheets

(56) References Cited

U.S. PATENT DOCUMENTS

2018/0308895 A1  10/2018  Kim et al.
2019/0214417 A1   7/2019  Matsuo

* cited by examiner

F I G . 1 4
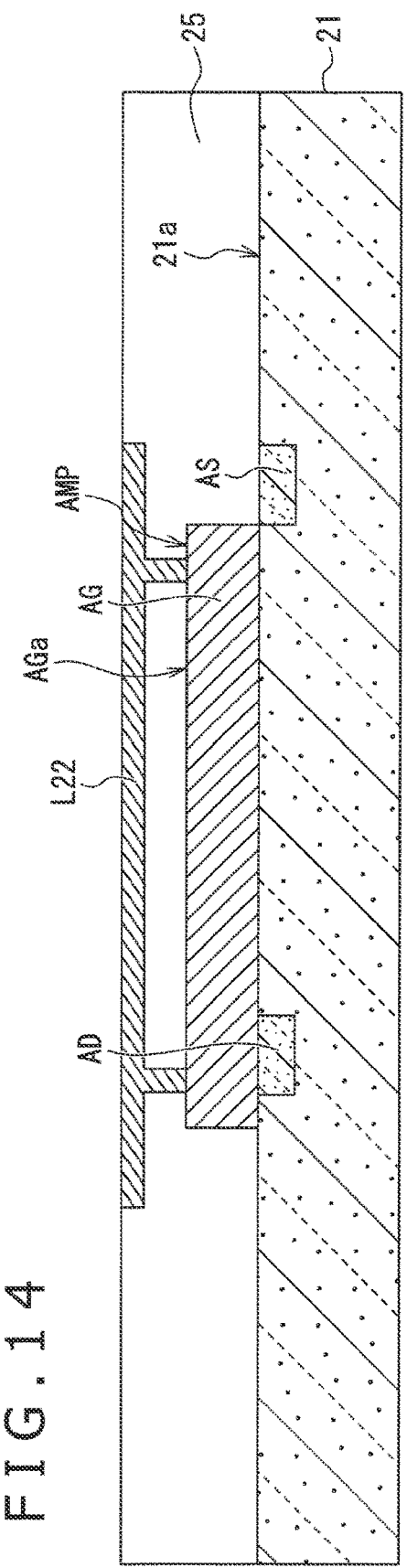
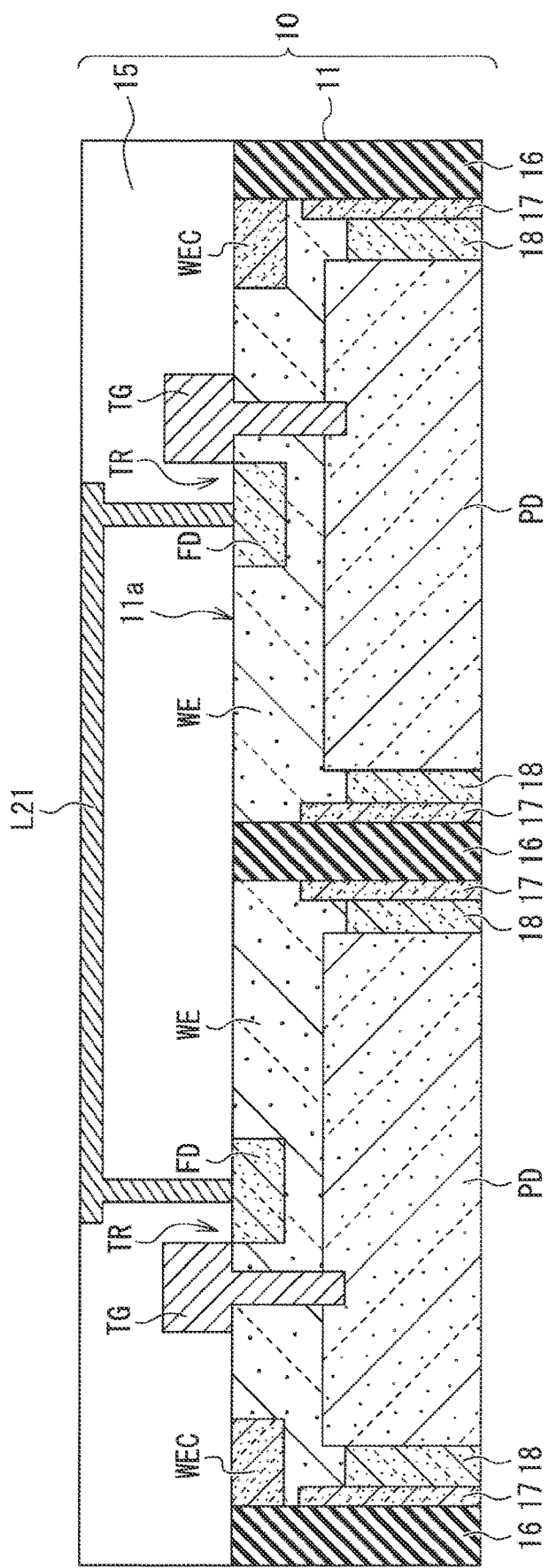

IMAGING DEVICE WITH IMPROVED LAYOUT OF READING CIRCUIT TRANSISTORS

CROSS REFERENCE TO RELATED APPLICATIONS

This application is a national stage application under 35 U.S.C. 371 and claims the benefit of PCT Application No. PCT/JP2020/010811 having an international filing date of 12 Mar. 2020, which designated the United States, which PCT application claimed the benefit of Japanese Patent Application No. 2019-068602 filed 29 Mar. 2019, the entire disclosures of each of which are incorporated herein by reference.

TECHNICAL FIELD

The present disclosure relates to an imaging device.

BACKGROUND ART

Conventionally, reduction in area per pixel of imaging devices having a two-dimensional configuration has been achieved by introduction of fine processes and improvements in packaging density. In recent years, imaging devices having a three-dimensional configuration have been developed to achieve reduction in size of imaging devices and increase in density of their pixels (for example, see PTL 1). Such imaging devices having the three-dimensional configuration, each include a first semiconductor substrate having a plurality of sensor pixels, and a second semiconductor substrate having readout circuits for readout processing of signals each of which is obtained by a corresponding one of the pixels. The second semiconductor substrate is laminated on one surface side of the first semiconductor substrate.

CITATION LIST

Patent Literature

[PTL 1]
  JP 2010-245506A

SUMMARY

Technical Problem

Readout circuits each include a selection transistor for selecting among sensor pixels, an amplification transistor for amplifying signals obtained by the sensor pixels, and a reset transistor for resetting the signals obtained by the sensor pixels. Arrangement and sizes (hereinafter, referred to as layout) of the transistors included in the readout circuit have an influence on the performance of the imaging device. Therefore, increase in the degree of freedom in layout has been desired.

The present disclosure has been made in view of the above-mentioned circumstances, and an object of the disclosure is to provide an imaging device capable of being increased in the degree of freedom of its layout.

Solution to Problem

An imaging device according to an aspect of the present disclosure includes a first semiconductor substrate including a sensor pixel configured to perform photoelectric conversion, and a second semiconductor substrate including a readout circuit configured to output a pixel signal according to an electric charge output from the sensor pixel. The second semiconductor substrate is laminated on a one surface side of the first semiconductor substrate so as to configure a laminated body. The second semiconductor substrate includes a first surface facing the first semiconductor substrate and a second surface located opposite to the first surface. The first transistor included in the readout circuit is disposed in the first surface, and the second transistor included in the readout circuit is disposed in the second surface.

According to this, compared with the case in which the transistors included in the readout circuit are disposed on only the one side of the second semiconductor substrate, the area of disposition regions allocated for the transistors can be made larger, resulting in an increase in the degree of freedom in layout of the readout circuit. For example, the amplification transistor may be disposed in the first surface of the second semiconductor substrate, and the selection transistor and the reset transistor may be disposed in the second surface of the second semiconductor substrate. This configuration makes it possible to maximize the area of the amplification transistor, allowing a decrease in random noise that occurs in the imaging device.

BRIEF DESCRIPTION OF DRAWINGS

FIG. 14 depicts a cross-sectional diagram illustrating a method of manufacturing the imaging device according to the second embodiment of the present disclosure.

DESCRIPTION OF EMBODIMENTS

Figure 1:
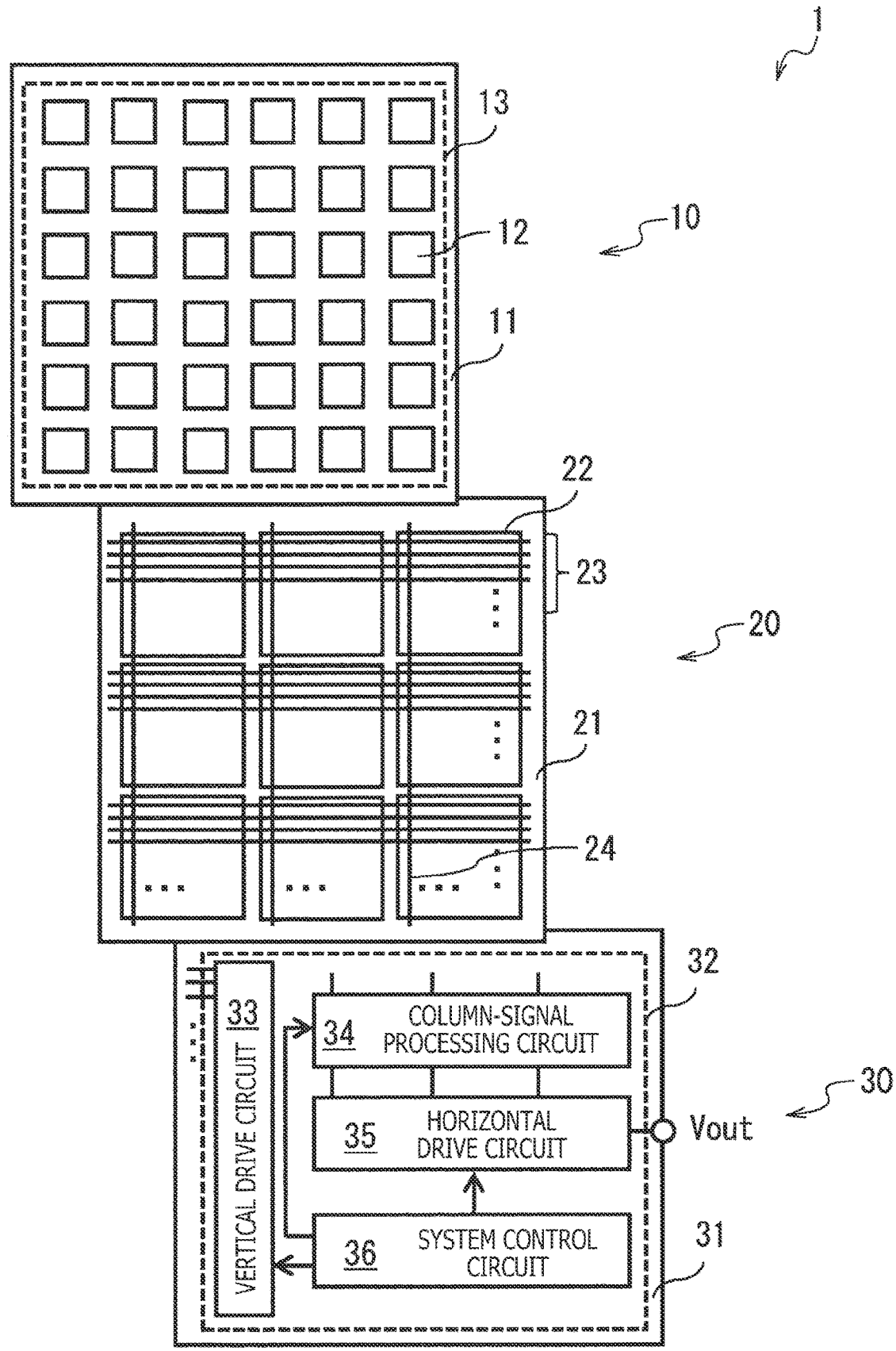
FIG. 1 depicts a schematic diagram illustrating an example of a configuration of an imaging device according to a first embodiment of the present disclosure.

Hereinafter, embodiments of the present disclosure will be described with reference to the drawings. In the drawings referred to in the following descriptions, the same or similar portions are denoted with the same or similar reference numerals and symbols. It should be noted, however, that the drawings are merely schematic and that relations of thicknesses to planer dimensions, ratios in thickness between layers, and the like may be different from actual ones. Therefore, specific thicknesses, dimensions, and the like should be determined in consideration of the following descriptions. Furthermore, it is a matter of course that portions may be contained in the drawings, in which portions have a difference in relation or ratio of dimensions between the drawings.

In the following descriptions, the definitions of directions, such as up and down, are merely definitions for convenience of description and do not limit the technical idea of the present disclosure. For example, it is needless to say that when the object is rotated by 90 degrees and observed, the up and down are converted to the left and right and read, and when the object is rotated by 180 degrees and observed, the up and down are inverted and read.

In addition, there are cases where the descriptions are made using the terms "X-axis direction," "Y-axis direction," and "Z axis direction." For example, the Z-axis direction parallels the direction of thickness of the laminated body to be described later. The X-axis direction and Y-axis direction are directions orthogonal to the Z-axis direction. The X-axis direction, Y-axis direction, and Z-axis direction are orthogonal to each other. In the following descriptions, the direction parallel to both the X-axis direction and the Y-axis direction is also referred to as the horizontal direction. Moreover, in the following descriptions, the term "plan view" means viewing from the Z-axis direction.

First Embodiment

FIG. 1 depicts a schematic diagram illustrating an example of a configuration of an imaging device 1 according to a first embodiment of the present disclosure. The imaging device 1 includes three substrates (a first substrate 10, a second substrate 20, and a third substrate 30). The imaging device 1 is an imaging device having a three-dimensional configuration which is configured by laminating the three substrates (the first substrate 10, the second substrate 20, and the third substrate 30). The first substrate 10, the second substrate 20, and the third substrate 30 are laminated in this order.

The first substrate 10 is such that a first semiconductor substrate 11 includes a plurality of sensor pixels 12 for performing photoelectric conversion. The plurality of sensor pixels 12 is disposed in a matrix in a pixel region 13 of the first substrate 10. The second substrate 20 is such that a second semiconductor substrate 21 includes readout circuits 22, one circuit for every four sensor pixels 12, which are for outputting pixel signals according to electric charges output from the sensor pixels 12. The second substrate 20 includes a plurality of pixel drive lines 23 which extends in the row direction, and a plurality of vertical signal lines 24 which extends in the column direction.

The third substrate 30 is such that a third semiconductor substrate 31 includes a logic circuit 32 for processing the pixel signals. The logic circuit 32 includes, for example, a vertical drive circuit 33, column-signal processing circuit 34, horizontal drive circuit 35, and system control circuit 36. The logic circuit 32 (specifically, the horizontal drive circuit 35) outputs an output voltage Vout of each sensor pixel 12 to the outside. In the logic circuit 32, for example, low-resistance regions including a silicide such as $CoSi_2$ or NiSi may be formed on the surfaces of impurity diffusion regions in contact with source electrodes and drain electrodes, with the silicide being formed by using a salicide (Self Aligned Silicide) process.

The vertical drive circuit 33 sequentially selects the plurality of sensor pixels 12 on a unit of row basis, for example. The column-signal processing circuit 34 performs correlated double sampling (Correlated Double Sampling: CDS) processing on a pixel signal that is output from each of the sensor pixels 12 in the row selected by the vertical drive circuit 33, for example. The column-signal processing circuit 34 performs the CDS processing, thereby extracting the signal level of the pixel signal and holding the pixel data according to an amount of light received by the corresponding one of the sensor pixels 12, for example. The horizontal drive circuit 35 sequentially outputs the pixel data held in the column-signal processing circuit 34 to the outside, for example. The system control circuit 36 controls drive of all blocks (the vertical drive circuit 33, column-signal processing circuit 34, and horizontal drive circuit 35) in the logic circuit 32, for example.

Figure 2:
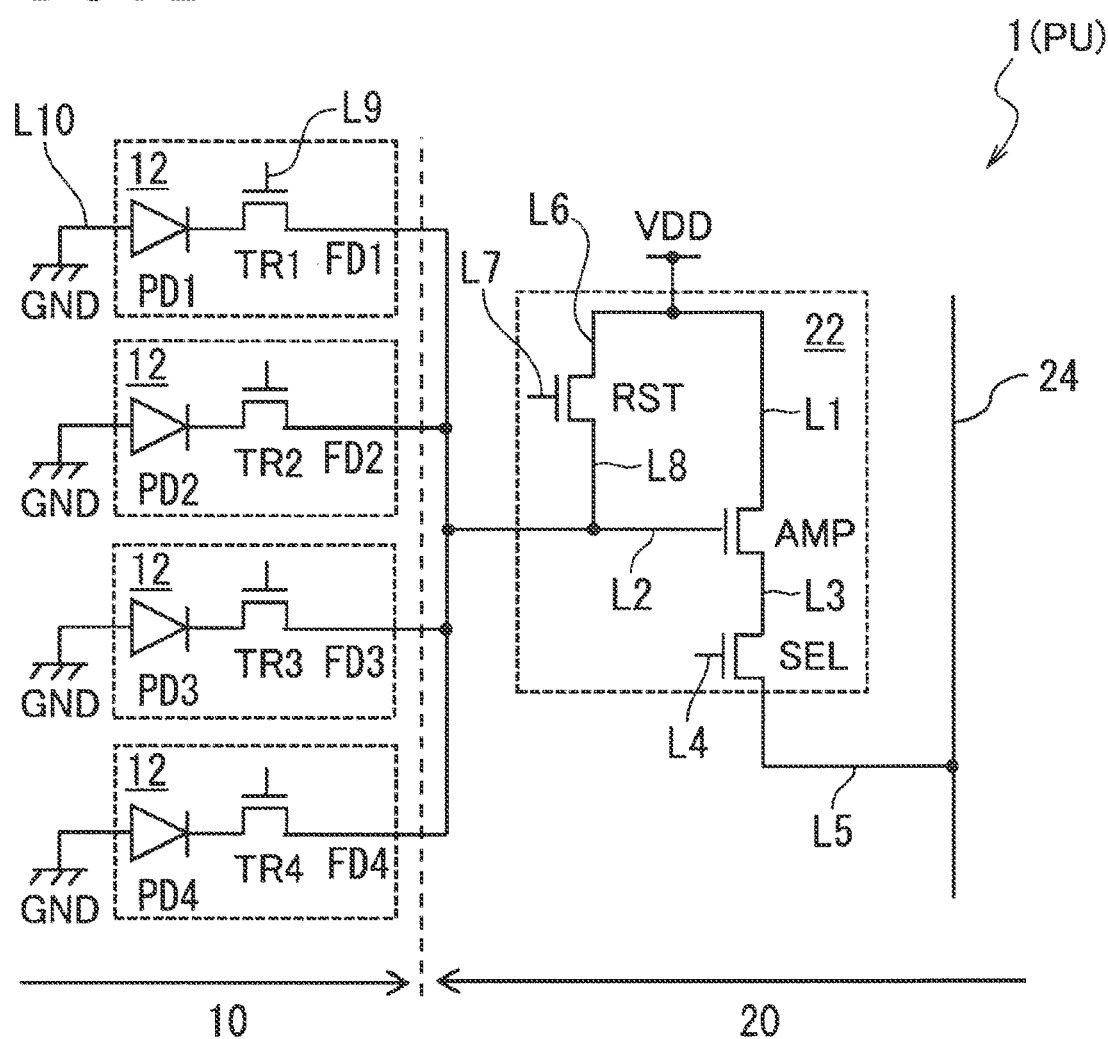
FIG. 2 depicts a circuit diagram illustrating an example of a configuration of a pixel unit according to the first embodiment of the present disclosure.

FIG. 2 depicts a circuit diagram illustrating an example of a configuration of a pixel unit PU according to the first embodiment of the present disclosure. As depicted in FIG. 2, in the imaging device 1, four sensor pixels 12 are coupled electrically to one readout circuit 22 so as to constitute one pixel unit PU. The four sensor pixels 12 share the one readout circuit 22, and the output from each of the four sensor pixels 12 is output to the shared readout circuit 22.

The sensor pixels 12 include components common to each other. In FIG. 2, in order to discriminate the components of the respective sensor pixels 12 from each other, a corresponding identification number (1, 2, 3, or 4) is given to the ends of the reference symbols (e.g., PD, TG, and FD to be described later) of components of the respective sensor pixels 12. Hereinafter, in cases where it is necessary to discriminate the components of the respective sensor pixels 12 from each other, such a corresponding identification number is given to the ends of the reference symbols of components of the respective sensor pixels 12. However, in cases where it is not necessary to discriminate the components of the respective sensor pixels 12 from each other, no identification number is given to the ends of the reference symbols of components of the sensor pixels 12.

The sensor pixels 12 each include for example, a photodiode PD (one example of a photoelectric conversion element), a transfer transistor TR that is electrically coupled to the photodiode PD, and a floating diffusion FD that temporarily holds an electric charge output from the photodiode PD via the transfer transistor TR. The photodiode PD performs photoelectric conversion to generate an electric charge according to the amount of received light. The cathode of the photodiode PD is electrically coupled to the source of the transfer transistor TR, and the anode of the photodiode PD is electrically coupled to a reference potential line (e.g., a ground). The drain of the transfer transistor TR is electrically coupled to the floating diffusion FD, and the gate electrode of the transfer transistor TR is electrically coupled to the pixel drive line 23. The transfer transistor TR is, for example, a CMOS (Complementary Metal Oxide Semiconductor) transistor.

The floating diffusions FD of the respective sensor pixels 12 sharing one readout circuit 22 are electrically coupled to each other and electrically coupled to an input terminal of the common readout circuit 22. The readout circuit 22 includes, for example, an amplification transistor AMP (one example of a first transistor), a reset transistor RST, and a selection transistor SEL (one example of a second transistor). Note that the selection transistor SEL may be omitted as necessary.

The source of the reset transistor RST (the input terminal of the readout circuit 22) is electrically coupled to the floating diffusions FD, and the drain of the reset transistor RST is electrically coupled to both a power source line VDD and the drain of the amplification transistor AMP. The gate electrode of the reset transistor RST is electrically coupled to the pixel drive line 23 (see FIG. 1). The source of the amplification transistor AMP is electrically coupled to the drain of the selection transistor SEL, and the gate electrode of the amplification transistor AMP is electrically coupled to the source of the reset transistor RST. The source of the selection transistor SEL (an output terminal of the readout circuit 22) is electrically coupled to the vertical signal line 24, and the gate electrode of the selection transistor SEL is electrically coupled to the pixel drive line 23 (see FIG. 1).

Figure 3:
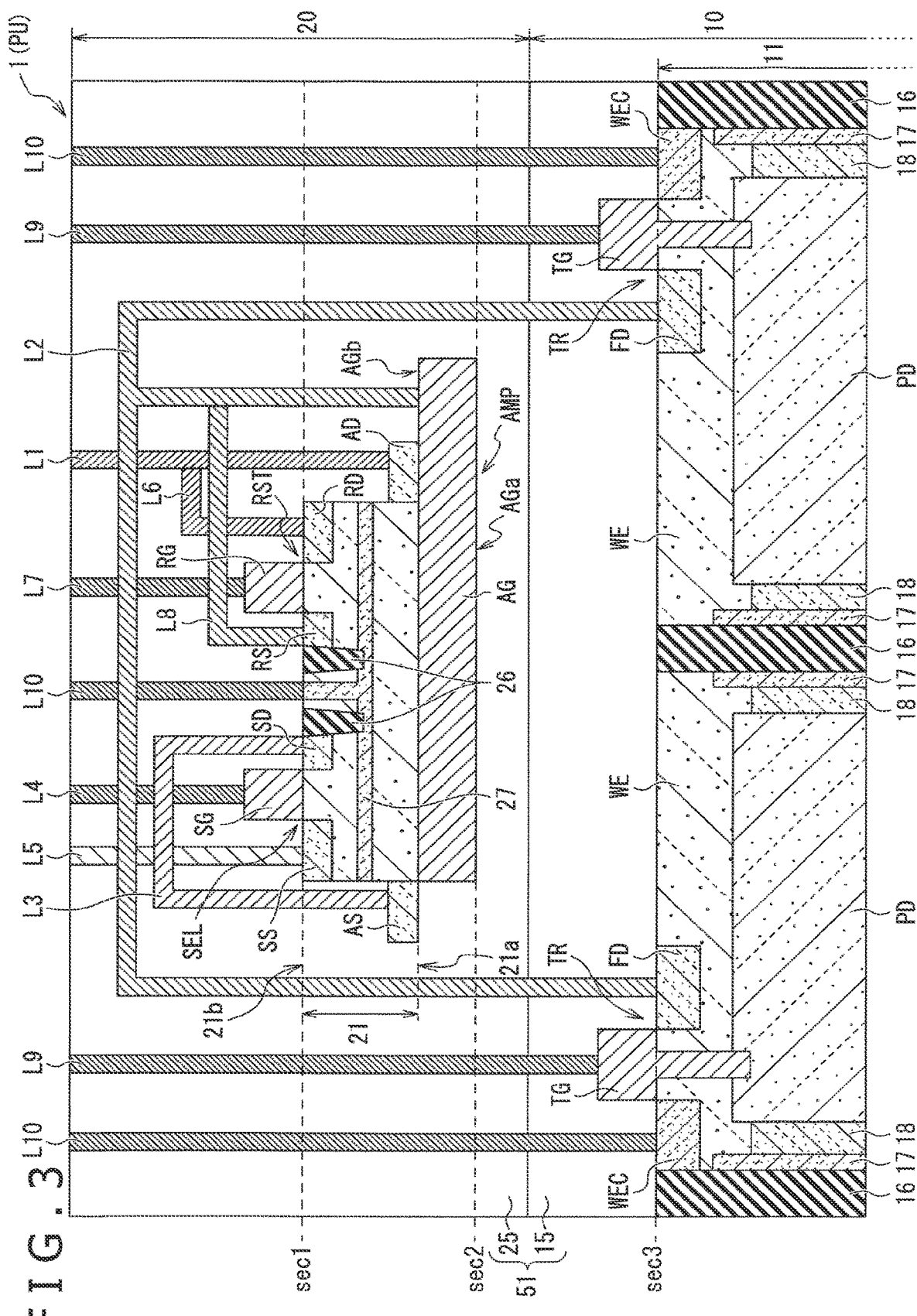
FIG. 3 depicts a cross-sectional diagram, in the depth direction, illustrating an example of a configuration of the pixel unit according to the first embodiment of the present disclosure.

When the transfer transistor TR is turned on, the transfer transistor TR transfers an electric charge of the photodiode PD to the floating diffusion FD. The gate electrode TG of the transfer transistor TR extends, for example, from a surface of the first semiconductor substrate 11 through a well layer WE to a depth reaching the photodiode PD, as illustrated in FIG. 3 to be described later. The reset transistor RST resets the potential of floating diffusions FD to a predetermined potential. When the reset transistor RST is turned on, the potential of the floating diffusions FD is reset to the potential of the power source line VDD. The selection transistor SEL controls an output timing of the pixel signal from the readout circuit 22.

The amplification transistor AMP generates, as a pixel signal, a signal of voltage according to the level of an electric charge held in the floating diffusion FD. The amplification transistor AMP is configured, as a source follower amplifier, to output the pixel signal of a voltage according to the level of an electric charge generated by the respective photodiodes PD. When the selection transistor SEL is turned on, the amplification transistor AMP amplifies the potential of the floating diffusion FD and outputs a voltage according to the thus-amplified potential to the column-signal processing circuit 34 via the vertical signal line 24. The reset transistor RST, the amplification transistor AMP, and the selection transistor SEL are, for example, CMOS transistors.

FIG. 3 depicts a cross-sectional diagram, in the thickness direction, illustrating an example of a configuration of the pixel unit PU according to the first embodiment of the present disclosure. Note that the cross-sectional diagram depicted in FIG. 3 is merely a schematic diagram and is not a diagram aimed at illustrating strictly and correctly the actual structure. The cross-sectional diagram depicted in FIG. 3 contains some portions in which the positions, in the horizontal direction, of transistors and impurity diffusion layers are intentionally modified for the purpose of easy understanding, through examination of the figure, of the description of the configuration of the pixel unit PU contained in the imaging device 1.

For example, in FIG. 3, the floating diffusions FD, the gate electrodes TG of the transfer transistors TR, and well contact layers WEC are disposed in line in the horizontal direction. However, in the actual structure, there are cases where the floating diffusions FD, gate electrodes TG, and well contact layers WEC are disposed in line in the direction perpendicular to the plane of the figure. In this case, interposing the gate electrodes TG therebetween, one of the floating diffusion FD and the well contact layer WEC is disposed in front of the plane of the figure, and the other of the floating diffusion FD and the well contact layer WEC is disposed behind the plane of the figure. The actual structure of the imaging device 1 will be depicted more accurately in FIGS. 4A to 4C to be described later.

As depicted in FIG. 3, the imaging device 1 is such that the second substrate 20 is laminated on the front surface 10*a* (one example of one surface) side of the first substrate 10 so as to configure a laminated body. On the front surface 10*a* side of the first substrate 10, there are disposed the photodiodes PD, transfer transistors TR, and floating diffusions FD. The photodiode PD, transfer transistor TR, and floating diffusion FD are disposed for every sensor pixel 12.

The other surface (e.g., the rear surface) of the first substrate 10 is a light incident surface. The imaging device 1 is a back-illuminated imaging device, on the rear surface of which color filters and light receiving lenses are disposed. The color filter and the light receiving lens are disposed for every sensor pixel 12.

The first semiconductor substrate 11 included in the first substrate 10 includes, for example, a silicon substrate. In a part of the front surface of the first semiconductor substrate 11 and in the vicinity of the part, the well layers WE of a first conductivity type (e.g., p-type) are disposed. In a region deeper than the well layers WE, the photodiodes PD of a second conductivity type (e.g., n-type) are disposed. Moreover, in the inside of each of the well layers WE, there are disposed the well contact layer WEC having a higher p-type concentration than the well layer WE, and the floating diffusion FD of an n-type. The well contact layer WEC is disposed in order to reduce contact resistance between the well layer WE and a wiring.

In the first semiconductor substrate 11, element isolation layers 16 are disposed which are each intended to electrically isolate adjacent sensor pixels 12 from each other. Each of the element isolation layers 16 has an STI (Shallow Trench Isolation) structure, for example, and extends in the depth direction of the first semiconductor substrate 11. The element isolation layer 16 includes, for example, silicon oxide. Moreover, in the first semiconductor substrate 11, a p-type layer 17 and an n-type layers 18 are disposed between the element isolation layer 16 and the photodiode PD. The p-type layer 17 is located on the element isolation layer 16 side, and the n-type layers 18 is located on the photodiode PD side.

On the front surface side of the first semiconductor substrate 11, the insulating film 15 is disposed. The insulating film 15 is a film that is formed by laminating either one or not smaller than two of a silicon oxide film (SiO), a silicon nitride film (SiN), a silicon oxynitride film (SiON), and a silicon carbonitride film (SiCN), for example.

The second semiconductor substrate 21 included in the second substrate 20 includes, for example, a silicon substrate. The second semiconductor substrate 21 has a front surface 21a (one example of a first surface) facing the first substrate 10, and a rear surface 21b (one example of a second surface) located opposite to the front surface 21a. In the FIG. 3, the front surface 21a is the upper surface and the rear surface 21b is the lower surface. In the front surface 21a, the amplification transistor AMP is disposed. In the rear surface 21b, the selection transistor SEL and the reset transistor RST are disposed.

The second semiconductor substrate 21 is provided with element isolation layers 26 and a p-type well layer 27. The element isolation layers 26 are disposed on the rear surface 21b side of the second semiconductor substrate 21, which thereby electrically isolate between the selection transistor SEL and the reset transistor RST. The well layer 27 is disposed in a range from the rear surface 21b to an intermediate position between the front surface 21a and the rear surface 21b. The well layer 27 electrically isolates the amplification transistor AMP disposed on the front surface 21a side of the second semiconductor substrate 21 from the selection transistor SEL and reset transistor RST which are both disposed on the rear surface 21b side of the second semiconductor substrate 21.

The second substrate 20 includes an insulating film 25 that covers the front surface 21a, rear surface 21b, and side surfaces of the second semiconductor substrate 21. The insulating film 25 is a film that is formed by laminating either one or not smaller than two of SiO, SiN, SiON, and SiCN, for example. The insulating film 15 of the first substrate 10 and the insulating film of the second substrate 20 are joined to each other to configure an interlayer insulating film 51.

The imaging device 1 includes a plurality of wirings L1 to L10 which is disposed within the interlayer insulating film 51 and is each electrically coupled to at least one of the first substrate 10 and the second substrate 20. As depicted in FIGS. 2 and 3, the wiring L1 electrically couples the drain AD of the amplification transistor AMP to the power source line VDD. The wiring L2 (one example of a second wiring) electrically couples the four floating diffusions FD, which are included in one pixel unit PU, to the gate electrode AG of the amplification transistor AMP. The wiring L3 electrically couples the source AS of the amplification transistor AMP to the drain SD of the selection transistor SEL. The wiring L4 electrically couples the gate electrode SG of the selection transistor SEL to the pixel drive line 23 (see FIG. 1).

The wiring L5 electrically couples the source SS of the selection transistor SEL to the vertical signal line 24. The wiring L6 electrically couples the drain RD of the reset transistor RST to the power source line VDD. The wiring L7 electrically couples the gate electrode RG of the reset transistor RST to the pixel drive line 23. The wiring L8 electrically couples the source RS of the reset transistor RST to the wiring L2. The wiring L9 (one example of a first wiring) electrically couples the gate electrode TG of the transfer transistor TR to the pixel drive line 23 (see FIG. 1). The wiring L10 electrically couples the well contact layer WEC to the reference potential line that supplies a reference potential (e.g., ground potential: 0 V). In the imaging device 1, the wiring L2 is coupled to the rear surface AGb (in FIG. 3, the upper surface) side of the gate electrode AG of the amplification transistor AMP.

In the wirings L1 to L10, wirings' portions extending in the thickness direction of the laminated body, include tungsten (W), and wirings' portions extending in a direction (e.g., horizontal direction) orthogonal to the thickness direction of the laminated body include copper (Cu) or a Cu alloy containing Cu as a principal component. However, in the embodiments of the present disclosure, the material of the wirings L1 to L10 is not limited to these materials and may include other material.

Figure 4A:
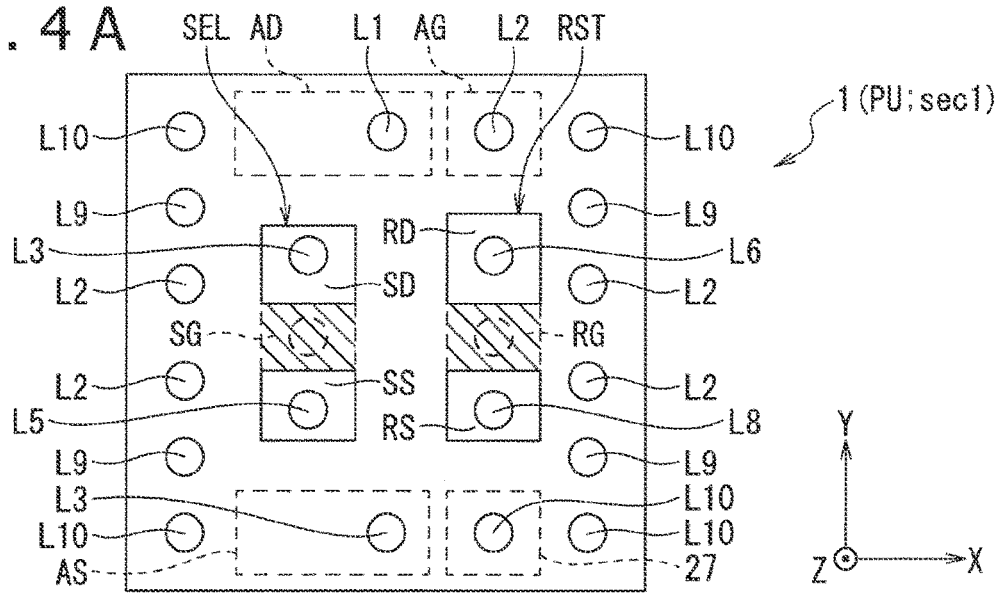
FIG. 4A depicts a cross-sectional diagram, in the horizontal direction, illustrating the example of the configuration of the pixel unit according to the first embodiment of the present disclosure.
Figure 4B:
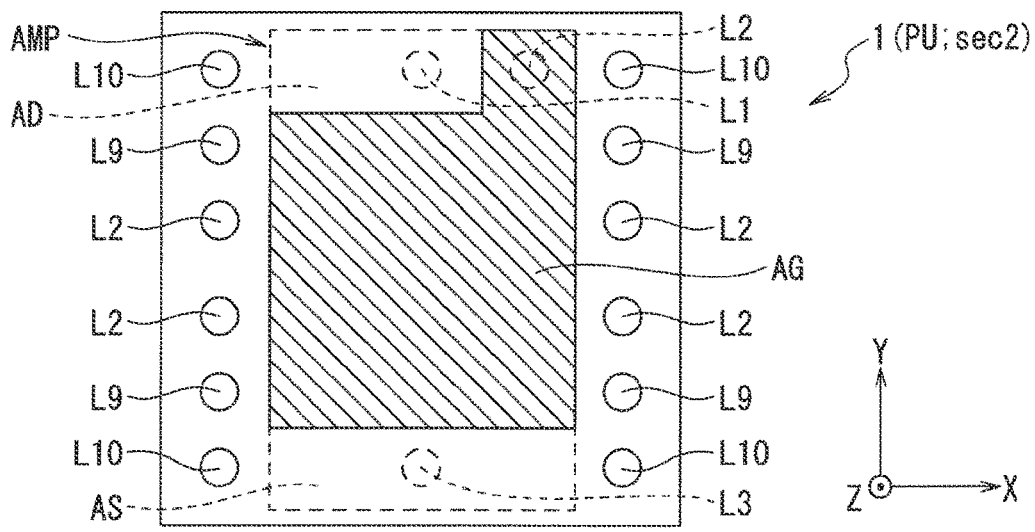
FIG. 4B depicts a cross-sectional diagram, in the horizontal direction, illustrating the example of the configuration of the pixel unit according to the first embodiment of the present disclosure.
Figure 4C:
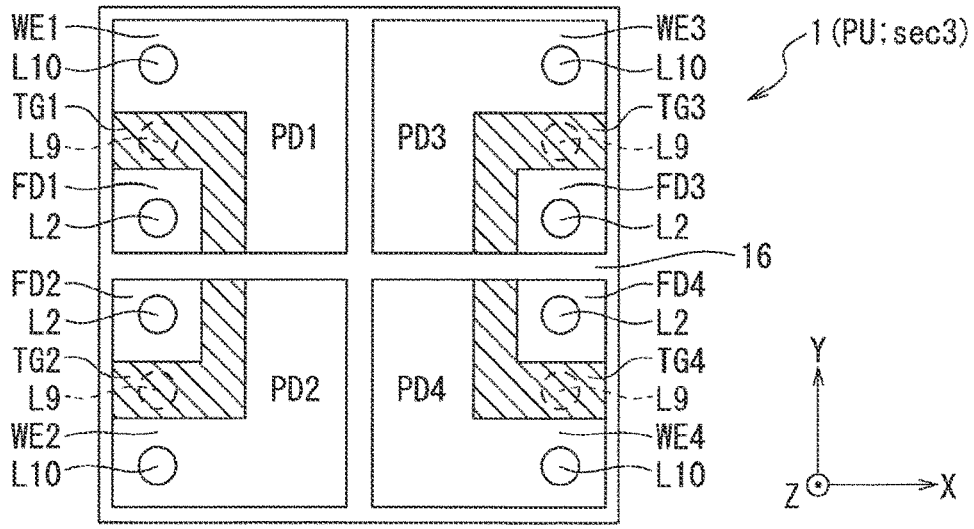
FIG. 4C depicts a cross-sectional diagram, in the horizontal direction, illustrating the example of the configuration of the pixel unit according to the first embodiment of the present disclosure.

FIGS. 4A to 4C depict cross-sectional diagrams, in the horizontal direction, illustrating an example of the configuration of the pixel unit PU according to the first embodiment of the present disclosure. More specifically, FIG. 4A depicts the cross-sectional diagram of the pixel unit PU cut horizontally at position sec1 depicted in FIG. 3. The position sec1 is at the same height as the upper surface of the gate electrode SG of the selection transistor SEL and the upper surface of the gate electrode RG of the reset transistor RST. FIG. 4B depicts the cross-sectional diagram of the pixel unit PU cut horizontally at position sec2 depicted in FIG. 3. The position sec2 is at the same height as the lower surface of the gate electrode AG of the amplification transistor AMP. FIG. 4C depicts the cross-sectional diagram of the pixel unit PU cut horizontally at position sec3 depicted in FIG. 3. The position sec1 is at the same height as the upper surface of gate electrode TG of the transfer transistor TR.

FIGS. 4A to 4C each depict the diagram of one pixel unit and are in a positional relation in which these diagrams are overlaid with each other in the thickness direction (e.g., Z-axis direction) of the laminated body. The selection transistor and reset transistor RST depicted in FIG. 4A, the amplification transistor AMP depicted in FIG. 4B, and the four sensor pixels 12 depicted in FIG. 4C are overlaid with each other in the Z-axis direction. As depicted in FIG. 4A, a transistor group including the selection transistor SEL and the reset transistor RST is located, in a plan view, at a center portion of the pixel unit PU. Outside the transistor group, a wiring group including the wirings L2, L9, and L10 is located. The wiring group is disposed to have bilateral symmetry, in a plan view, with the transistor group being interposed therebetween.

As depicted in FIG. 4B, the amplification transistor AMP is located, in a plan view, at a center portion of the pixel unit PU. In the thickness direction of the laminated body, the amplification transistor AMP, selection transistor SEL, and reset transistor RST are in a positional relation in which they are overlaid with each other. Moreover, in a plan view, outside the amplification transistor AMP, the wiring group including the wirings L2, L9, and L10 is located. The wiring group is disposed to have bilateral symmetry, in a plan view, with the amplification transistor AMP being interposed therebetween.

As depicted in FIG. 4C, the four sensor pixels 12 included in one pixel unit PU are disposed close to each other via the element isolation layer 16. Moreover, in each of the four sensor pixels 12, the gate electrode TG of the transfer transistor TR is interposed, in a plan view, between the floating diffusion FD and the well layer WE. The floating diffusion FD and the well layer WE are partitioned with the gate electrode TG. As depicted in FIG. 3, the photodiodes PD are located below the floating diffusions FD, well layers WE, and gate electrodes TG.

Figure 5:
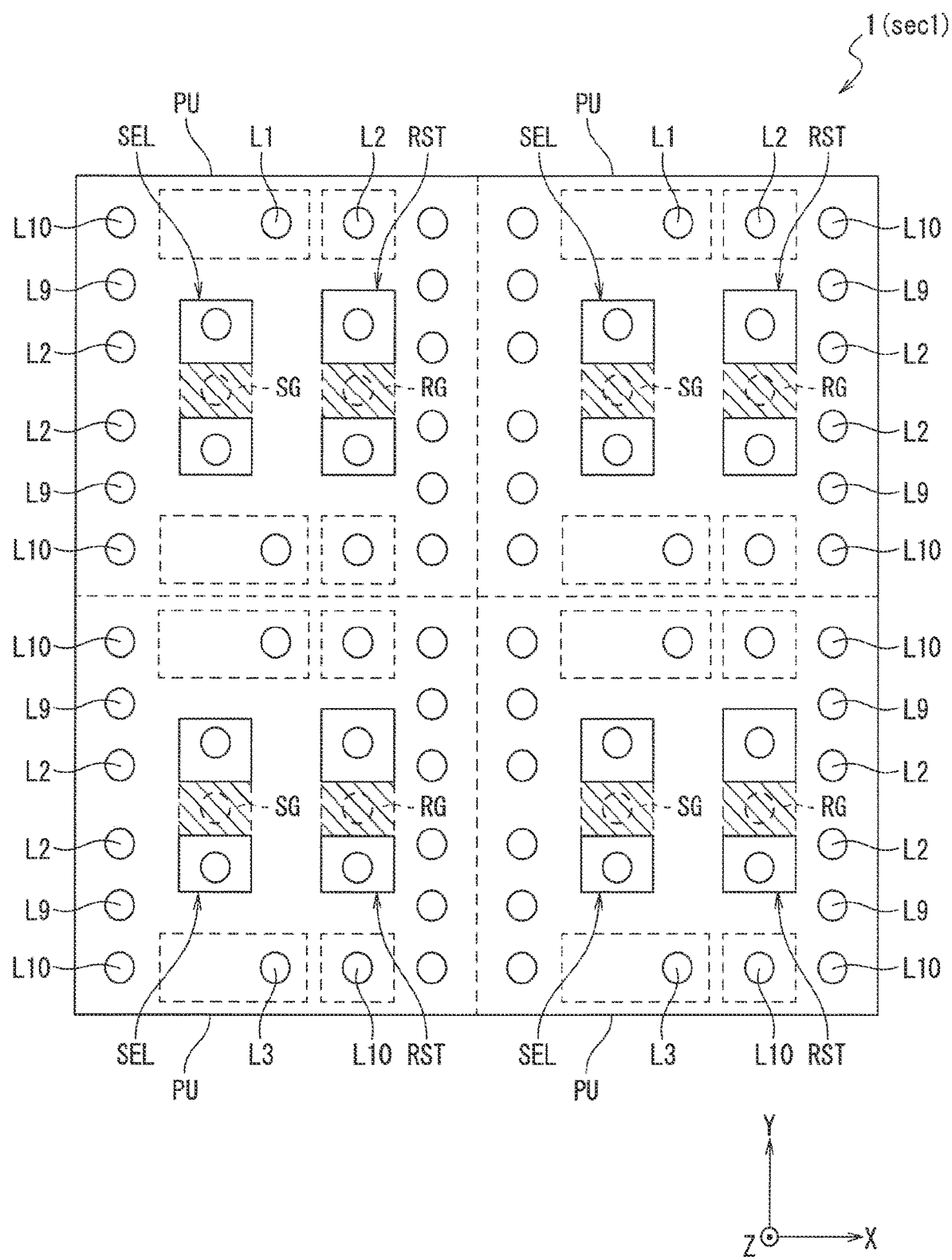
FIG. 5 depicts a cross-sectional diagram, in the horizontal direction, illustrating an example of a layout of a plurality of pixel units.
Figure 6:
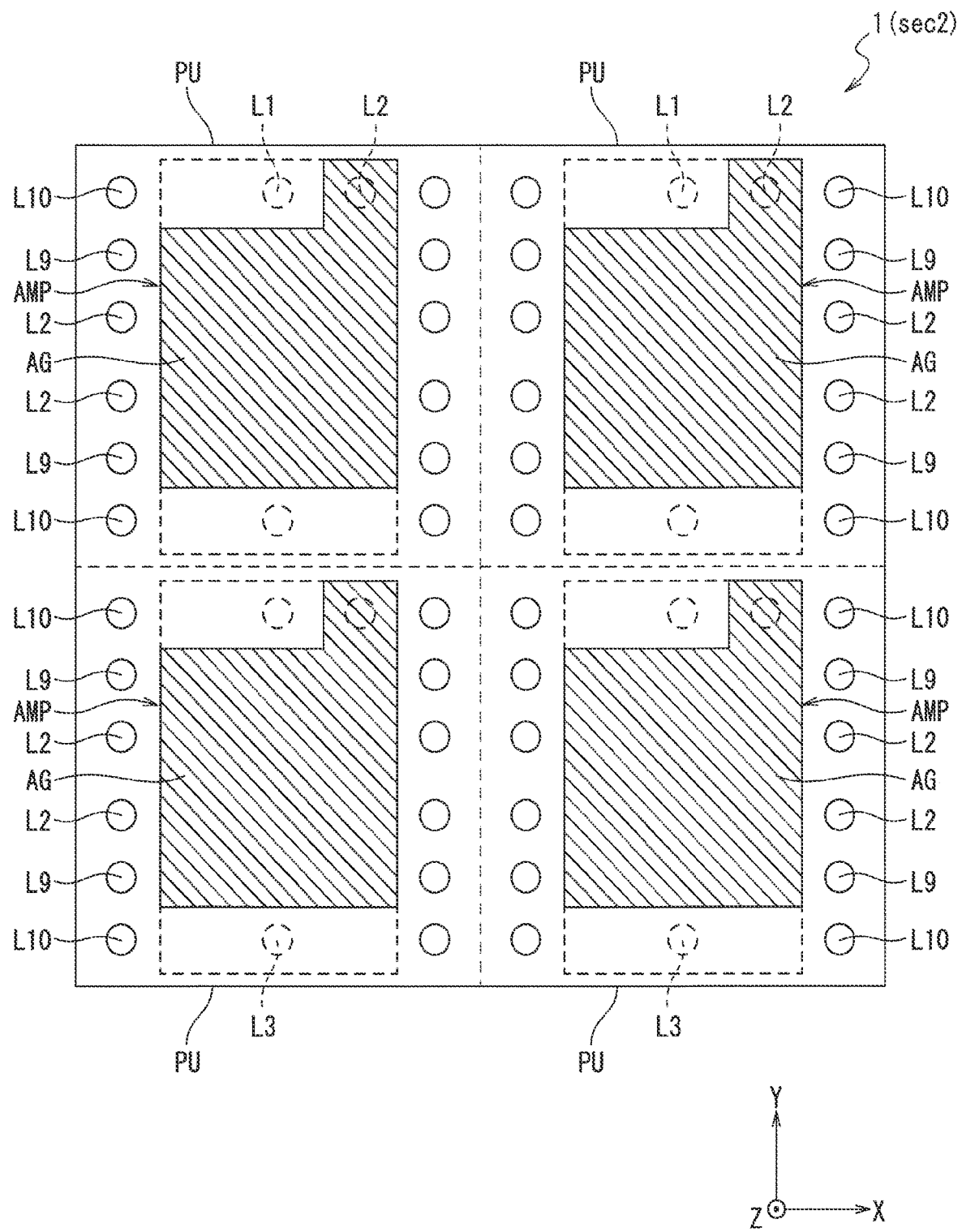
FIG. 6 depicts a cross-sectional diagram, in the horizontal direction, illustrating the example of the layout of the plurality of pixel units.
Figure 7:
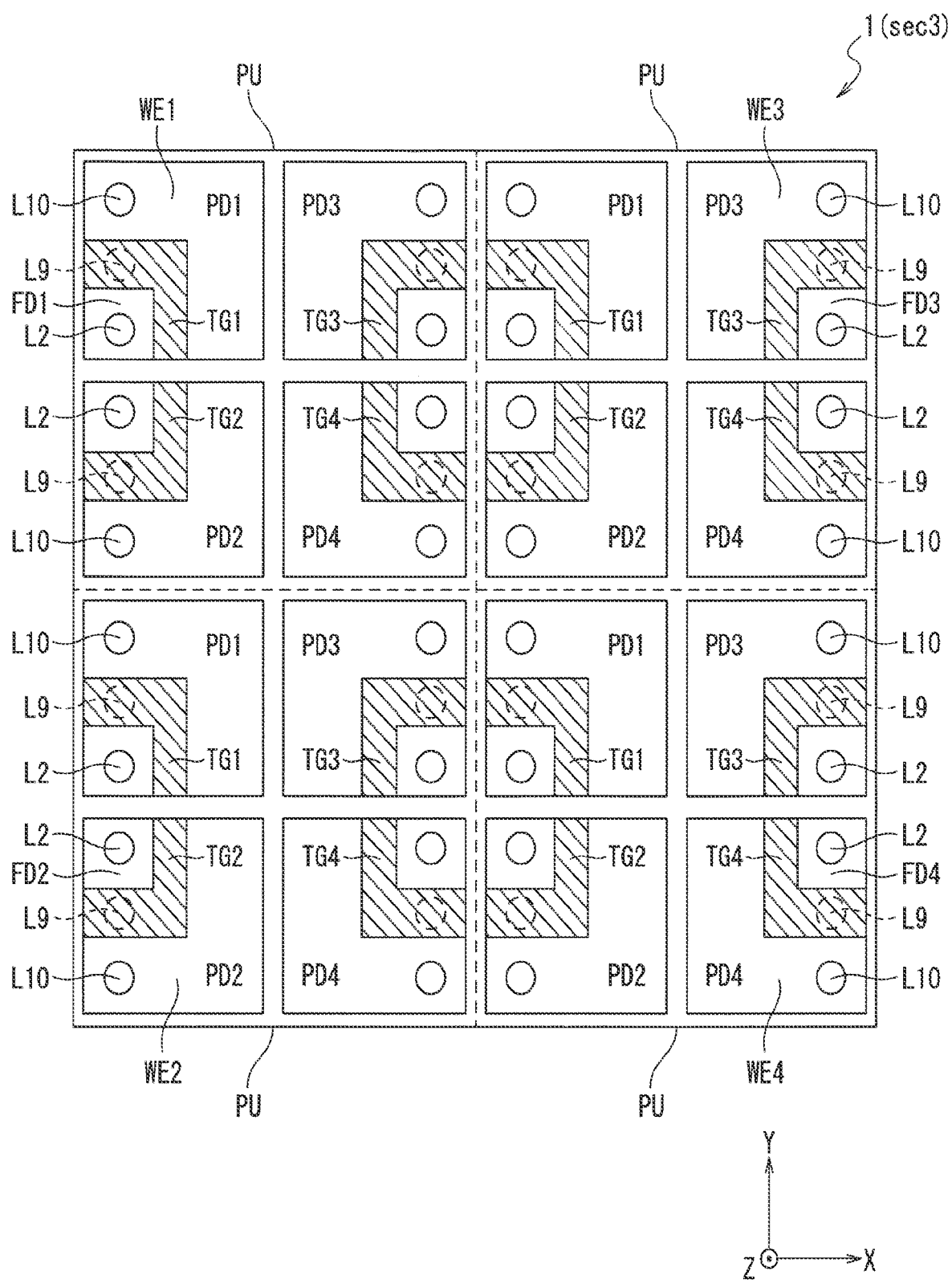
FIG. 7 depicts a cross-sectional diagram, in the horizontal direction, illustrating the example of the layout of the plurality of pixel units.

FIGS. 5 to 7 depict cross-sectional diagrams, in the horizontal direction, illustrating an example of a layout of a plurality of pixel units PU. More specifically, FIG. 5 depicts the cross-sectional diagram of the imaging device 1 cut horizontally at the position sec3 depicted in FIG. 3. FIG. 6 depicts the cross-sectional diagram of the imaging device 1 cut horizontally at the position sec2 depicted in FIG. 3. FIG. 7 depicts the cross-sectional diagram of the first substrate 10 cut horizontally at the position sec1 depicted in FIG. 3. As depicted in FIGS. 5 to 7, in the imaging device 1, the plural pixel units PU are arranged at regular intervals in the X-axis direction and Y-axis direction. The pixel units PU are disposed repeatedly in the X-axis direction and Y-axis direction.

Next, a method of manufacturing the imaging device 1 will be described. Note that the imaging device 1 is manufactured using various apparatuses, such as, a film forming apparatus (including a CVD (Chemical Vapor Deposition) apparatus and a sputtering apparatus), an ion implantation apparatus, a heat treatment apparatus, an etching apparatus, and a bonding apparatus. Hereinafter, these apparatuses are collectively referred to as manufacturing equipment.

Figure 8:
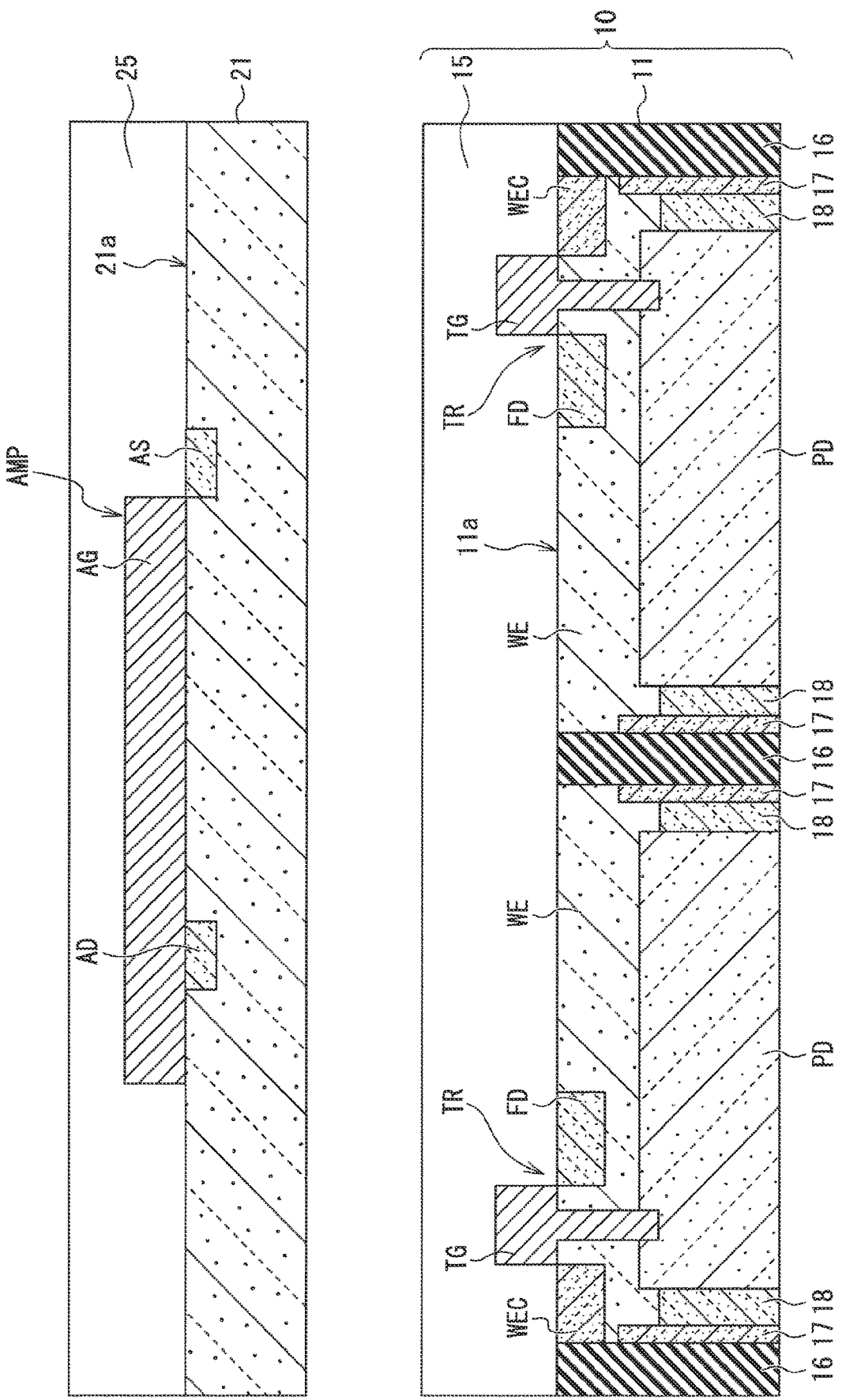
FIG. 8 depicts a cross-sectional diagram illustrating a method of manufacturing the imaging device according to the first embodiment of the present disclosure.

FIGS. 8 to 11 depict cross-sectional diagrams illustrating the method of manufacturing imaging device 1 according to the first embodiment of the present disclosure. As depicted in FIG. 8, the manufacturing equipment is used to form, through CMOS processes, on the front surface 11a side of the first semiconductor substrate 11, well layers WE, element isolation layers 16, p-type layers 17, n-type layers 18, photodiodes PD, gate electrodes TG of transfer transistors TR, floating diffusions FD, and well contact layers WEC. Then, the manufacturing equipment forms an insulating film 15 on the front surface 11a side of the first semiconductor substrate 11, followed by flattening its surface. This completes the first substrate 10.

Prior to, after, or in parallel with the manufacturing process of the first substrate 10, the manufacturing equipment forms the amplification transistor AMP in the front surface 21a (the upper surface in FIG. 8) of the second semiconductor substrate 21. For example, the manufacturing equipment forms the source AS and drain AD of the amplification transistor AMP, on the front surface 21a of the second semiconductor substrate 21. Then, the manufacturing equipment forms the gate electrode AG of the amplification transistor AMP, on the front surface 21a of the second semiconductor substrate 21. The gate electrode AG is formed such that the drain AD is covered and such that the source AS is exposed. Alternatively, the manufacturing equipment may form the drain AD and the gate electrode AG, followed by forming the source AS through use of the gate electrode AG as a mask. Next, the manufacturing equipment forms the insulating film 25 on the front surface 21a side of the second semiconductor substrate 21, followed by flattening its surface.

Figure 9:
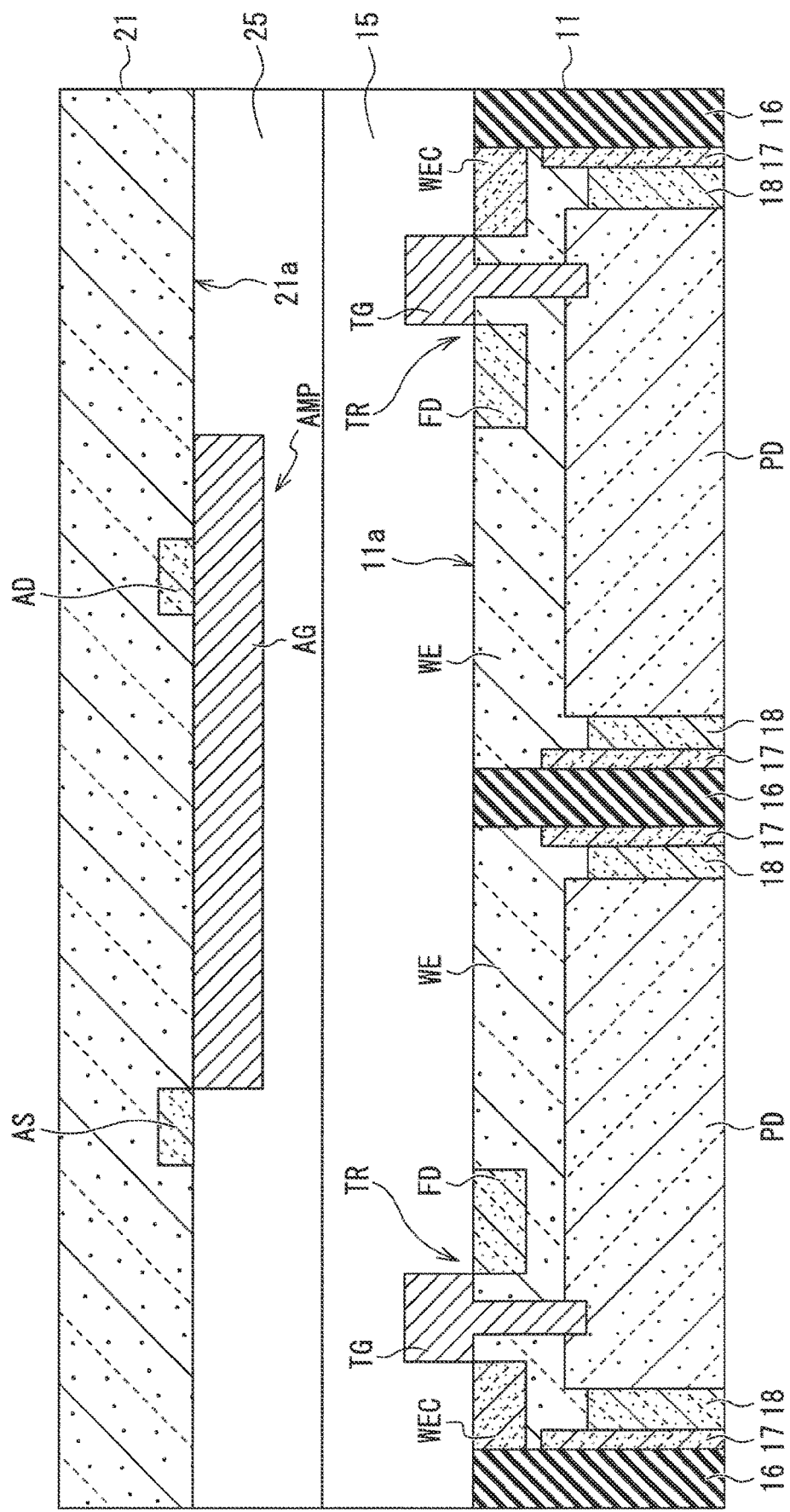
FIG. 9 depicts a cross-sectional diagram illustrating the method of manufacturing the imaging device according to the first embodiment of the present disclosure.

Next, the manufacturing equipment causes the insulating film 25 formed on the second semiconductor substrate 21 and the insulating film 15 formed on the first substrate 10 to face each other, and then to join the insulating films 15 and 25 together. The method of joining is, for example, plasma joining. With this process, as depicted in FIG. 9, the first semiconductor substrate 11 and the second semiconductor substrate 21 are integrated into a laminated body.

Figure 10:
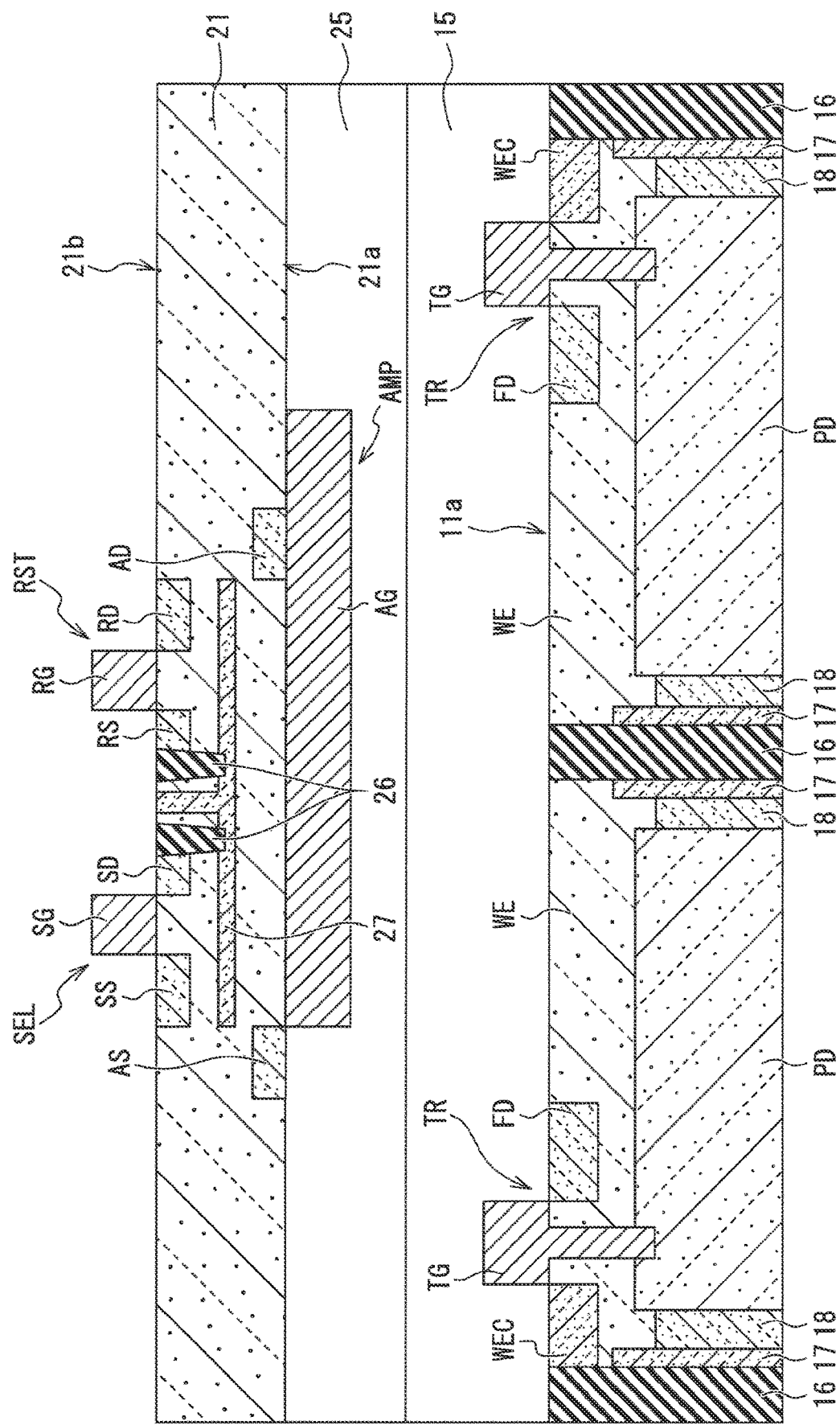
FIG. 10 depicts a cross-sectional diagram illustrating the method of manufacturing the imaging device according to the first embodiment of the present disclosure.

Next, as depicted in FIG. 10, the manufacturing equipment forms, through CMOS processes, in the rear surface 21b (the upper surface in FIG. 10) of the second semiconductor substrate 21, the element isolation layers 26, the well layers 27, selection transistors SEL, and reset transistors RST.

Figure 11:
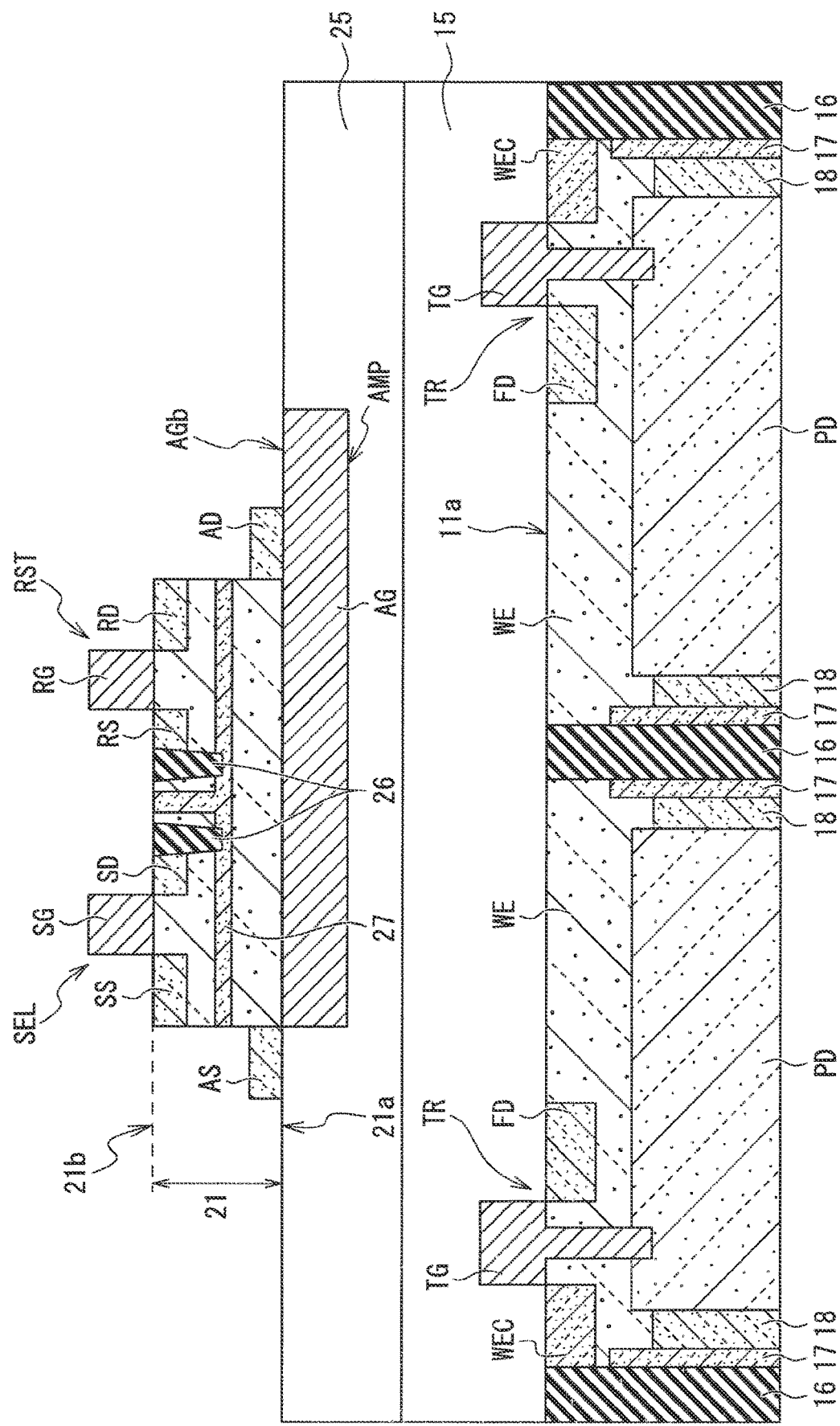
FIG. 11 depicts a cross-sectional diagram illustrating the method of manufacturing the imaging device according to the first embodiment of the present disclosure.

Next, as depicted in FIG. 11, the manufacturing equipment partially removes the second semiconductor substrate 21, thereby exposing the source AS, drain AD and gate electrode AG of the amplification transistor AMP. For example, the manufacturing equipment forms a first mask on the rear surface 21b side of the second semiconductor substrate 21 such that the first mask has a shape to cover both the selection transistor SEL and the reset transistor RST and to cause the remaining region to be open. The first mask includes, for example, a resist mask and a hard mask.

Then, for the second semiconductor substrate 21, the manufacturing equipment performs dry etching on portions exposed from the first mask, thereby causing the source AS and drain AD of the amplification transistor AMP to be exposed. After that, the manufacturing equipment removes the first mask from the rear surface 21b side of the second semiconductor substrate 21.

Next, the manufacturing equipment forms a second mask on the rear surface 21b side of the second semiconductor substrate 21 such that the second mask has a shape to cover the selection transistor SEL, the reset transistor RST, and the source AS and drain AD of the amplification transistor AMP, and to cause the remaining region to be open. The second mask includes, for example, a resist mask and a hard mask. Then, for the second semiconductor substrate 21, the manufacturing equipment performs dry etching on portions exposed from the second mask. In this dry etching, the insulating film 25 is used as an etching stopper. With this process, the gate electrode AG of the amplification transistor AMP is exposed from below the second semiconductor substrate 21. After that, the manufacturing equipment removes the second mask from the rear surface 21b side of the second semiconductor substrate 21.

Next, the manufacturing equipment forms the wirings L1 to L10 depicted in FIG. 3. For example, the manufacturing equipment performs, a plurality of times, forming process of insulating films, flattening process of the insulating films, forming process of contact holes, and forming process of wirings both on the insulating films and in the contact holes. As described above, the wirings extending in the vertical direction include tungsten (W) and the wirings extending in the horizontal direction include Cu or a Cu alloy. This completes the imaging device 1.

As described so far, the imaging device 1 according to the first embodiment of the present disclosure includes the first semiconductor substrate 11 including the sensor pixels for performing photoelectric conversion, and the second semiconductor substrate 21 including the readout circuits 22 for outputting pixel signals according to electric charges output from the sensor pixels 12. The second semiconductor substrate 21 is laminated on the front surface 11a side of the first semiconductor substrate 11 to configure a laminated body. The second semiconductor substrate 21 has the front surface 21a facing the first semiconductor substrate 11 and the rear surface 21b located opposite to the front surface 21a. The amplification transistor AMP included in the readout circuit 22 is disposed in the front surface 21a, and the selection transistor SEL and reset transistor RST included in the readout circuit 22 are disposed in the rear surface 21b.

With this configuration, compared with the case in which the transistors included in the readout circuit 22 are disposed on only the one side of the second semiconductor substrate 21, the area of a disposition region allocated for the transistors can be made larger, resulting in an increase in the degree of freedom in layout of the readout circuit 22. For example, the amplification transistor AMP is disposed in the front surface 21a of the second semiconductor substrate 21, and the selection transistor SEL and the reset transistor RST are disposed in the rear surface 21b of the second semiconductor substrate 21. With this configuration, in each of the pixel units PU, the area of the amplification transistor AMP can be maximized. Such maximized areas of the amplification transistors AMP allow a decrease in random noise that occurs in the imaging device.

Second Embodiment

In the second embodiment described above, it has been described that the floating diffusion FD is coupled to the rear surface AGb side of the gate electrode AG of the amplification transistor AMP via the wiring L2. However, in the embodiment of the present disclosure, the mode of coupling of the floating diffusion FD to the gate electrode AG is not limited to this. For example, the floating diffusion FD may be coupled to the front surface AGa side of the gate electrode AG via the wiring L2.

Figure 12:
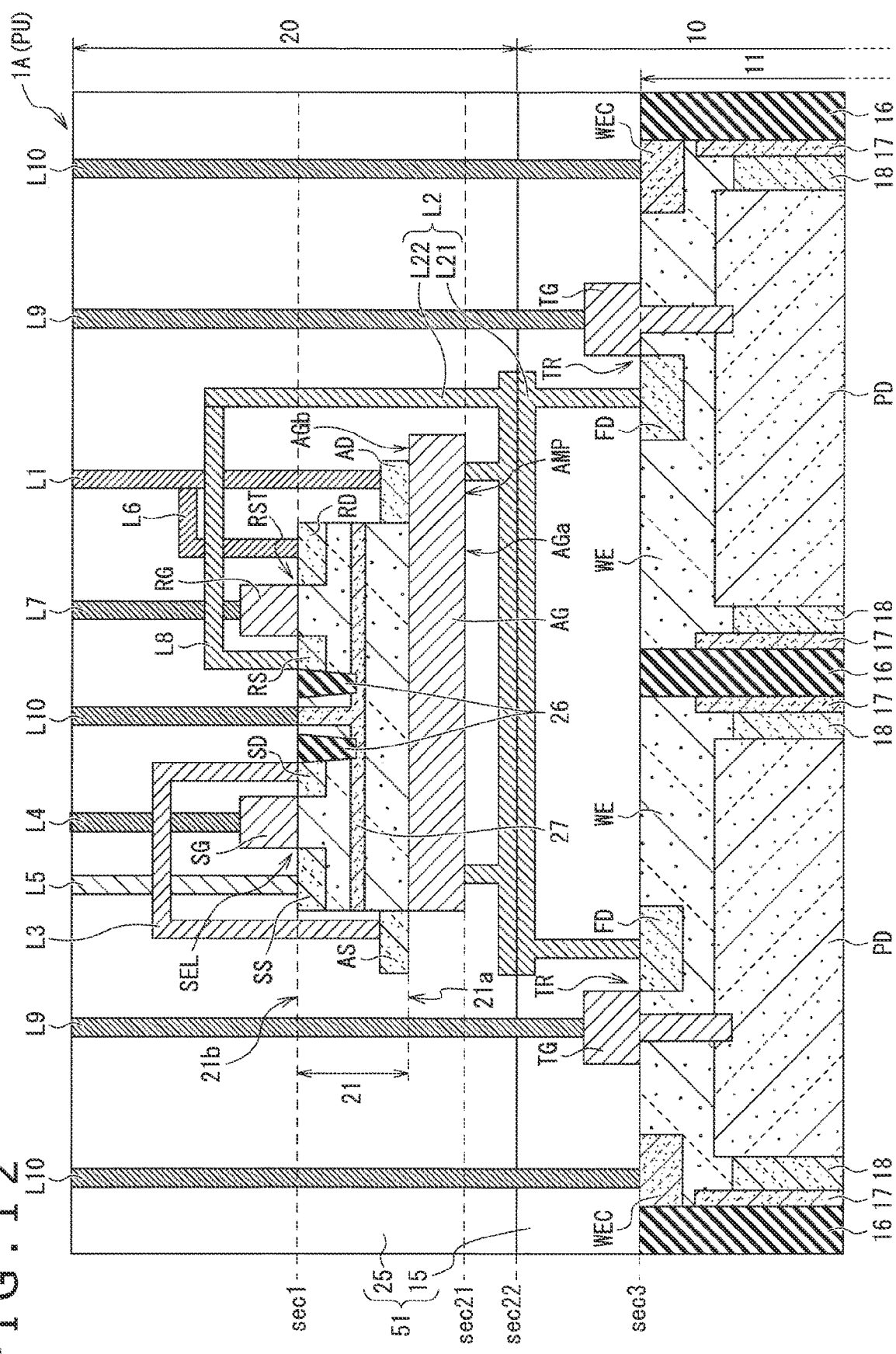
FIG. 12 depicts a cross-sectional diagram, in the thickness direction, illustrating an example of a configuration of an imaging device according to a second embodiment of the present disclosure.

FIG. 12 depicts a cross-sectional diagram, in the thickness direction, illustrating an example of the configuration of an imaging device 1A according to a second embodiment of the present disclosure. Note that, as in the case of FIG. 12 described in the first embodiment, the cross-sectional diagram depicted in FIG. 12 as well is merely a schematic diagram and is not a diagram aimed at illustrating strictly and correctly the actual structure. The cross-sectional diagram depicted in FIG. 12 contains some portions in which positions, in the horizontal direction, of transistors and impurity diffusion layers are intentionally modified for the purpose of easy understanding, through examination of the figure, of the description of the configuration of the imaging device 1A. The actual structure of the imaging device 1A will be depicted more accurately in FIGS. 13A to 13D to be described later.

As depicted in FIG. 12, the imaging device 1A includes the wiring L2 that electrically couples the floating diffusion FD to the gate electrode AG of the amplification transistor AMP. The wiring L2 includes a first wiring part L21 disposed in the first substrate 10 and a second wiring part L22 disposed in the second substrate 20. The first wiring part L21 is electrically coupled to four floating diffusions FD1 to FD4 included in one pixel unit PU. The second wiring part L22 is coupled to the gate electrode AG of the amplification transistor AMP that is included in the same pixel unit PU as the four floating diffusions FD1 to FD4. The second wiring part L22 is coupled to the front surface AGa of the gate electrode AG.

In the first wiring part L21 and the second wiring part L22, wirings' portions extending in the Z-axis direction include tungsten (W). The wirings' portions extending in a direction (e.g., horizontal direction) orthogonal to the thickness direction of the laminated body include copper (Cu) or a Cu alloy. The first wiring part L21 and the second wiring part L22 are each formed in a plate shape at the joint plane between the first substrate 10 and the second substrate 20, with the plate shape spreading in the horizontal direction. Then, at the joint plane, the first wiring part L21 and the second wiring part L22 are integrated together by Cu—Cu bonding.

Figure 13A:
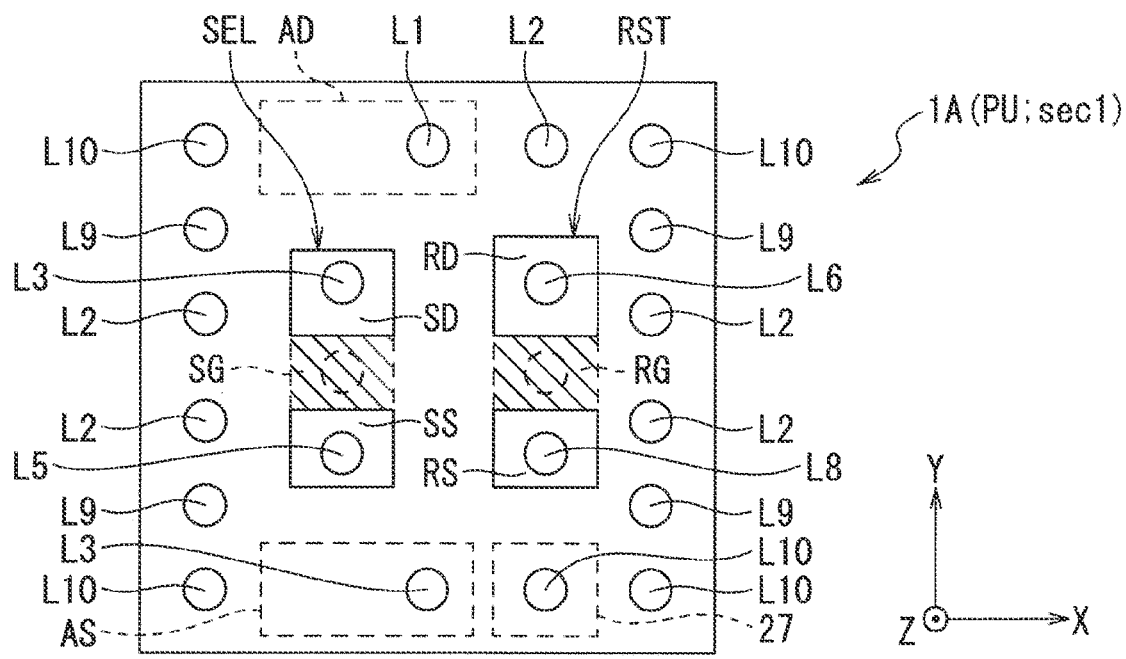
FIG. 13A depicts a cross-sectional diagram, in the horizontal direction, illustrating an example of a configuration of a pixel unit according to the second embodiment of the present disclosure.
Figure 13B:
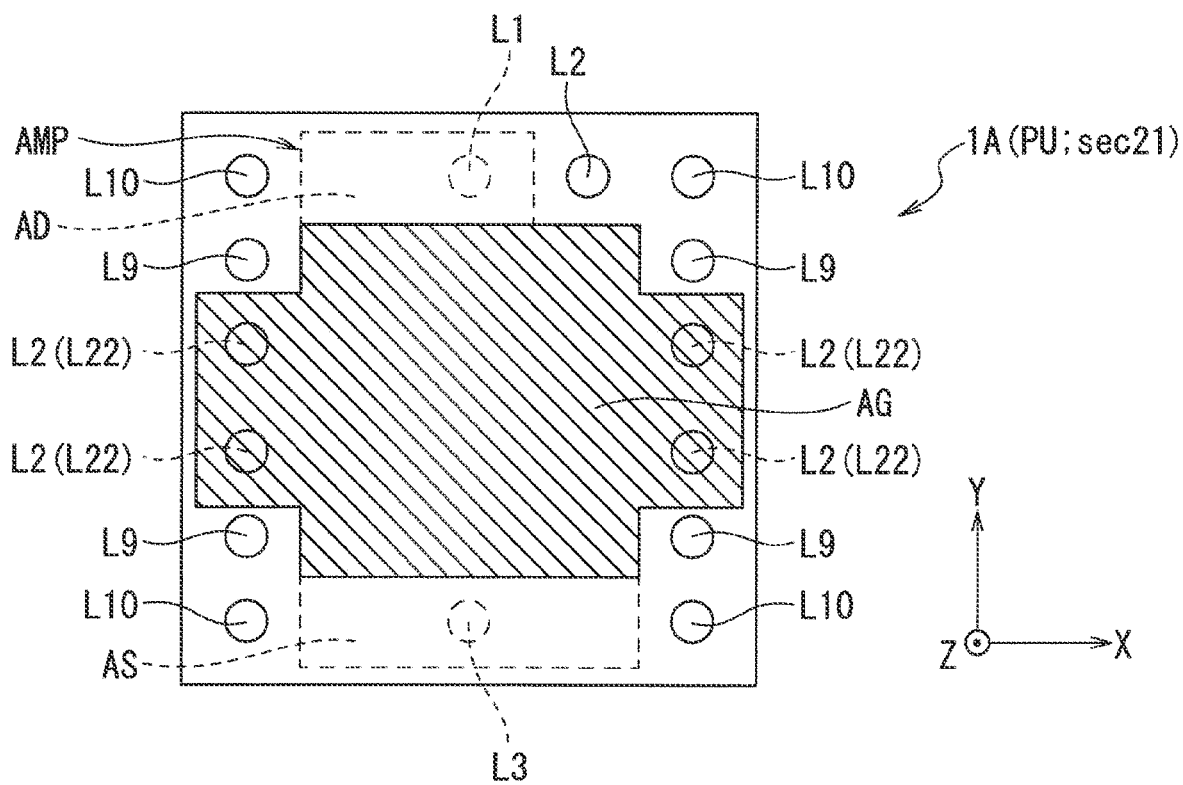
FIG. 13B depicts a cross-sectional diagram, in the horizontal direction, illustrating the example of the configuration of the pixel unit according to the second embodiment of the present disclosure.
Figure 13C:
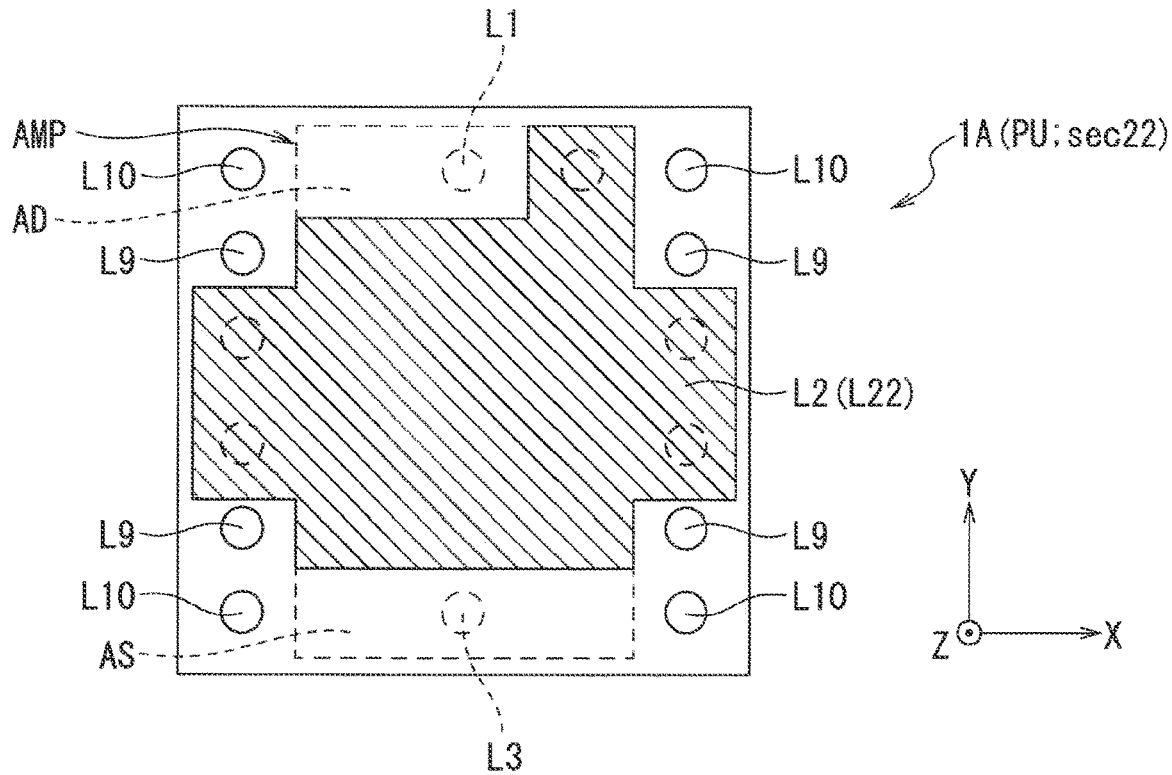
FIG. 13C depicts a cross-sectional diagram, in the horizontal direction, illustrating the example of the configuration of the pixel unit according to the second embodiment of the present disclosure.
Figure 13D:
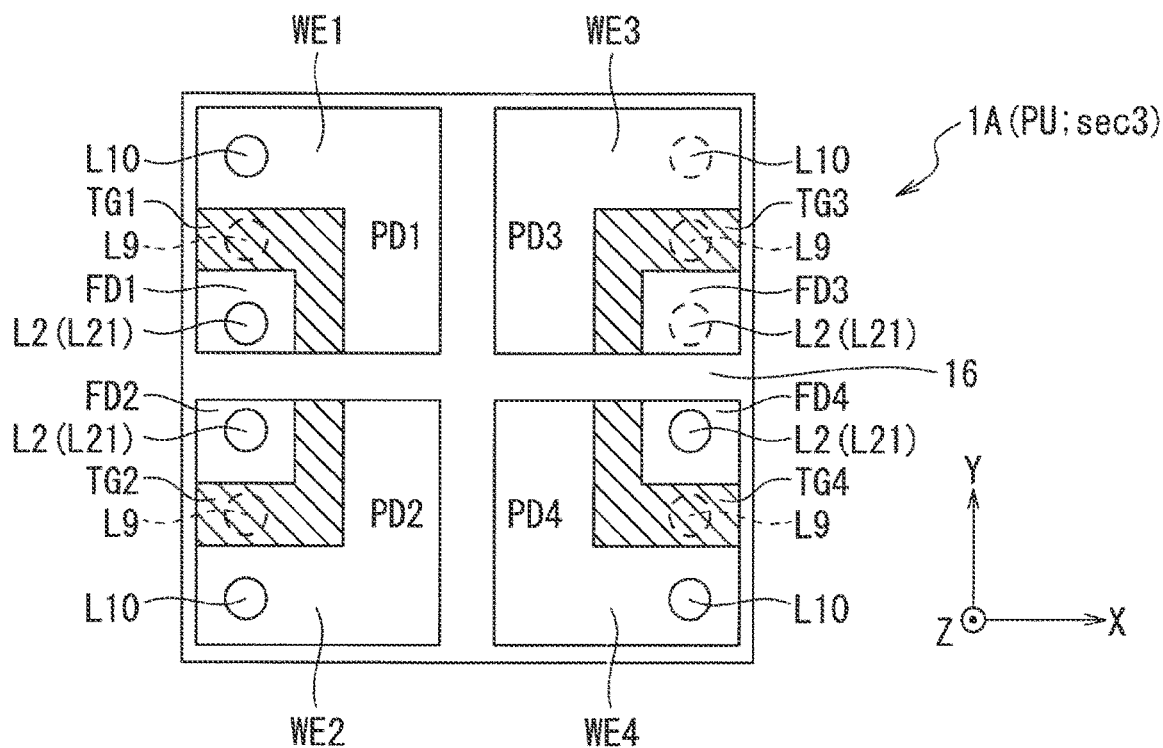
FIG. 13D depicts a cross-sectional diagram, in the horizontal direction, illustrating the example of the configuration of the pixel unit according to the second embodiment of the present disclosure.

FIGS. 13A to 13D depict cross-sectional diagrams, in the horizontal direction, illustrating an example of the configuration of the pixel unit PU according to the second embodiment of the present disclosure. More specifically, FIG. 13A depicts the cross-sectional diagram of the pixel unit PU cut horizontally at position sec1 depicted in FIG. 12. FIG. 13B depicts the cross-sectional diagram of the pixel unit cut horizontally at position sec2l depicted in FIG. 12. The position sec2l is at the same height as the lower surface of the gate electrode AG of the amplification transistor AMP. FIG. 13C depicts the cross-sectional diagram of the pixel unit PU cut horizontally at position sec22 depicted in FIG. 12. The position sec22 is the joint plane between the first substrate 10 and the second substrate 20. FIG. 13D depicts the cross-sectional diagram of the pixel unit PU cut horizontally at the position sec1 depicted in FIG. 12.

FIGS. 13A to 13D each depict the diagram of one pixel unit and are in a positional relation in which these diagrams are overlaid with each other in the Z-axis direction. The selection transistor and reset transistor RST depicted in FIG. 13A, the amplification transistor AMP depicted in FIG. 13B, the plate-shaped wiring L2 depicted in FIG. 13C, and the four sensor pixels 12 depicted in FIG. 13D are overlaid with each other in the Z-axis direction. As depicted in FIG. 13A, in the imaging device 1A as well, a transistor group including the selection transistor SEL and the reset transistor RST is located, in a plan view, at a center portion of the pixel unit PU. Outside the transistor group, a wiring group including the wirings L2, L9, and L10 is located. The wiring group is disposed to have bilateral symmetry, in a plan view, with the transistor group being interposed therebetween.

As described above, in the imaging device 1A, wiring L2 is coupled not to the rear surface AGb, but to the front surface AGa of the gate electrode AG of the amplification transistor AMP. For this reason, as depicted in FIG. 13A, regarding a plurality of wirings L2 in the imaging device 1A, the wirings' portions that are coupled to the gate electrodes AG do not appear at the position sec1.

As depicted in FIG. 13B, even in the imaging device 1A, the amplification transistor AMP is located, in a plan view, at a center portion of the pixel unit PU. In a plan view, outside the amplification transistor AMP, a wiring group coupled to the sensor pixels 12 (see FIG. 2) is located. The wiring group includes the wirings L2, L9, and L10. At least a part of the wiring group is disposed to have bilateral symmetry, in a plan view from the Z-axis direction, with the amplification transistor AMP being interposed therebetween. Note that the gate electrode AG of the imaging device 1A does not have any region allocated for coupling to the wiring L2 on the rear surface AGb side (for example, as depicted in FIG. 4B, the region adjacent to the drain AD in the X-axis direction), so that the region of the drain AD is wider by that region.

As depicted in FIG. 13C, at the position sec22, the second wiring part L22 of the wiring L2 is formed in a plate shape that expands in the horizontal direction. Although not depicted, at the position sec22, the first wiring part L21 as well of the wiring L2 is formed in a plate shape that expands in the horizontal direction. For example, at the position sec22, the first wiring part L21 and the second wiring part L22 have the same shape and size as each other. As depicted in FIG. 13D, the configuration of the imaging device 1A at the position sec3 is the same as that of the imaging device 1 at the position sec3 depicted in FIG. 4C.

FIGS. 14 to 17 depict cross-sectional diagrams illustrating a method of manufacturing imaging device 1A according to the second embodiment of the present disclosure. As depicted in FIG. 14, manufacturing equipment is used to form, through CMOS processes, on the front surface 11a side of the first semiconductor substrate 11, each of well layers WE, element isolation layers 16, p-type layers 17, n-type layers 18, photodiodes PD, gate electrodes TG of transfer transistors TR, floating diffusions FD, and well contact layers WEC. Then, the manufacturing equipment forms an insulating film 15 on the front surface 11a side of the first semiconductor substrate 11. Then, the manufacturing equipment partially etches the insulating film 15 to form contact holes on the floating diffusions FD.

Next, the manufacturing equipment forms a first wiring part L21 that is located from the floating diffusions FD through the contact holes to the top of the insulating film 15. The method of forming the first wiring part L21 is not particularly limited, however, it may include a single damascene method or a dual damascene method, for example. After the formation of the insulating film 15, the manufacturing equipment flattens both the upper surface of the insulating film 15 and the upper surface of the first wiring part L21. Through the flattening, the upper surface of the insulating film 15 and the upper surface of the first wiring part L21 become flush with each other (for example, a state in which there exists no step between the upper surface of the insulating film 15 and the upper surface of the first wiring part L21). This completes the first substrate 10.

Prior to, after, or in parallel with the manufacturing process of the first substrate 10, the manufacturing equipment forms the amplification transistor AMP in the front surface 21a (the upper surface in FIG. 3) of the second semiconductor substrate 21. The method of forming the amplification transistor AMP is the same as that described in the first embodiment with reference to FIG. 8. Then, the manufacturing equipment forms the insulating film 25 on the front surface 21a side of the second semiconductor substrate 21. Then, the manufacturing equipment partially etches the insulating film 25 to form contact holes on the front surface AGa of the gate electrode AG of the amplification transistor AMP.

Then, the manufacturing equipment forms a wiring (a part of the second wiring part L22) that is located from the front surfaces AGa of the gate electrode AG through the contact holes to the top of the insulating film 25. The method of forming the wiring is not particularly limited, however, it may include a single damascene method or a dual damascene method, for example. After the formation of the insulating film 25, the manufacturing equipment flattens both the upper surface of the insulating film 25 and the upper surface of the second wiring part L22. Through the flattening, the upper surface of the insulating film 25 and the upper surface of the second wiring part L22 become flush with each other (for example, a state in which there exists no step between the upper surface of the insulating film 25 and the upper surface of the second wiring part L22).

Figure 15:
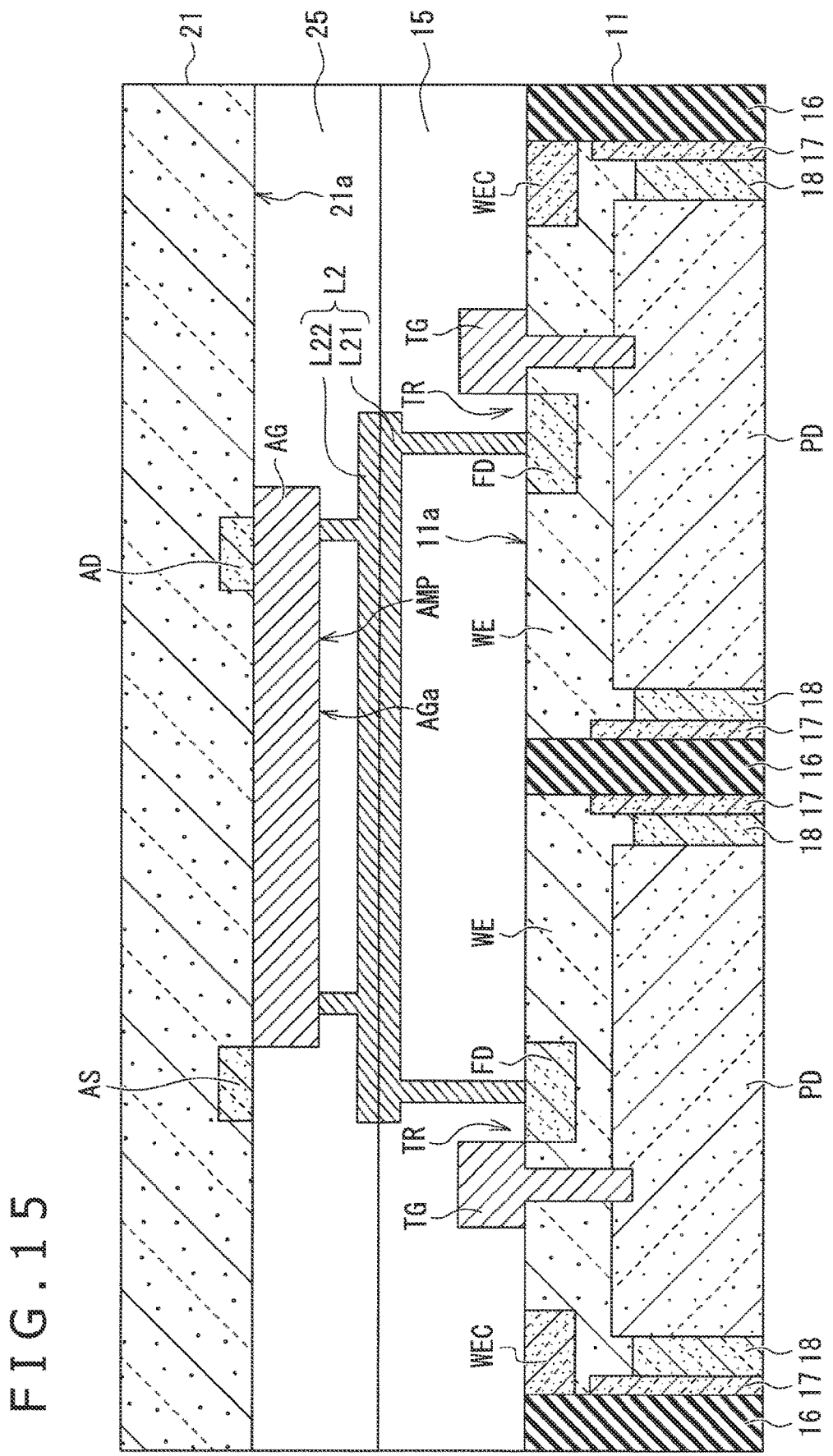
FIG. 15 depicts a cross-sectional diagram illustrating the method of manufacturing the imaging device according to the second embodiment of the present disclosure.

Next, the manufacturing equipment causes the insulating film 25 formed on the second semiconductor substrate 21 and the insulating film 15 formed on the first substrate 10 to face each other, and then to join the insulating films 15 and 25 together and also to join the first wiring part L21 and the second wiring part L22 together. The method of joining is, for example, plasma joining. With this process, as depicted in FIG. 15, the first semiconductor substrate 11 and the second semiconductor substrate 21 are integrated into a laminated body. In addition, the first wiring part L21 and the second wiring part L22 are integrated into the wiring L2.

Figure 16:
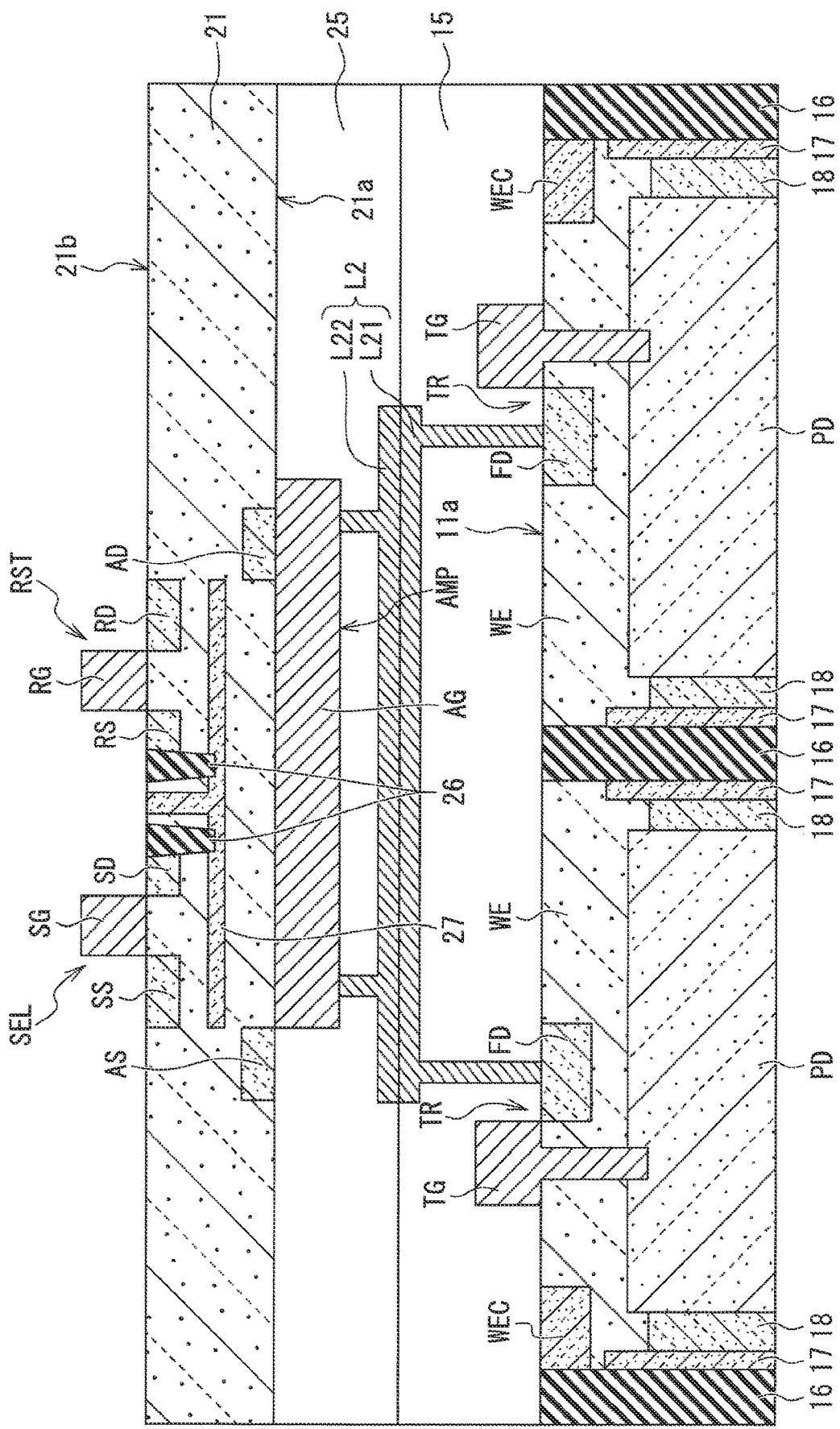
FIG. 16 depicts a cross-sectional diagram illustrating the method of manufacturing the imaging device according to the second embodiment of the present disclosure.
Figure 17:
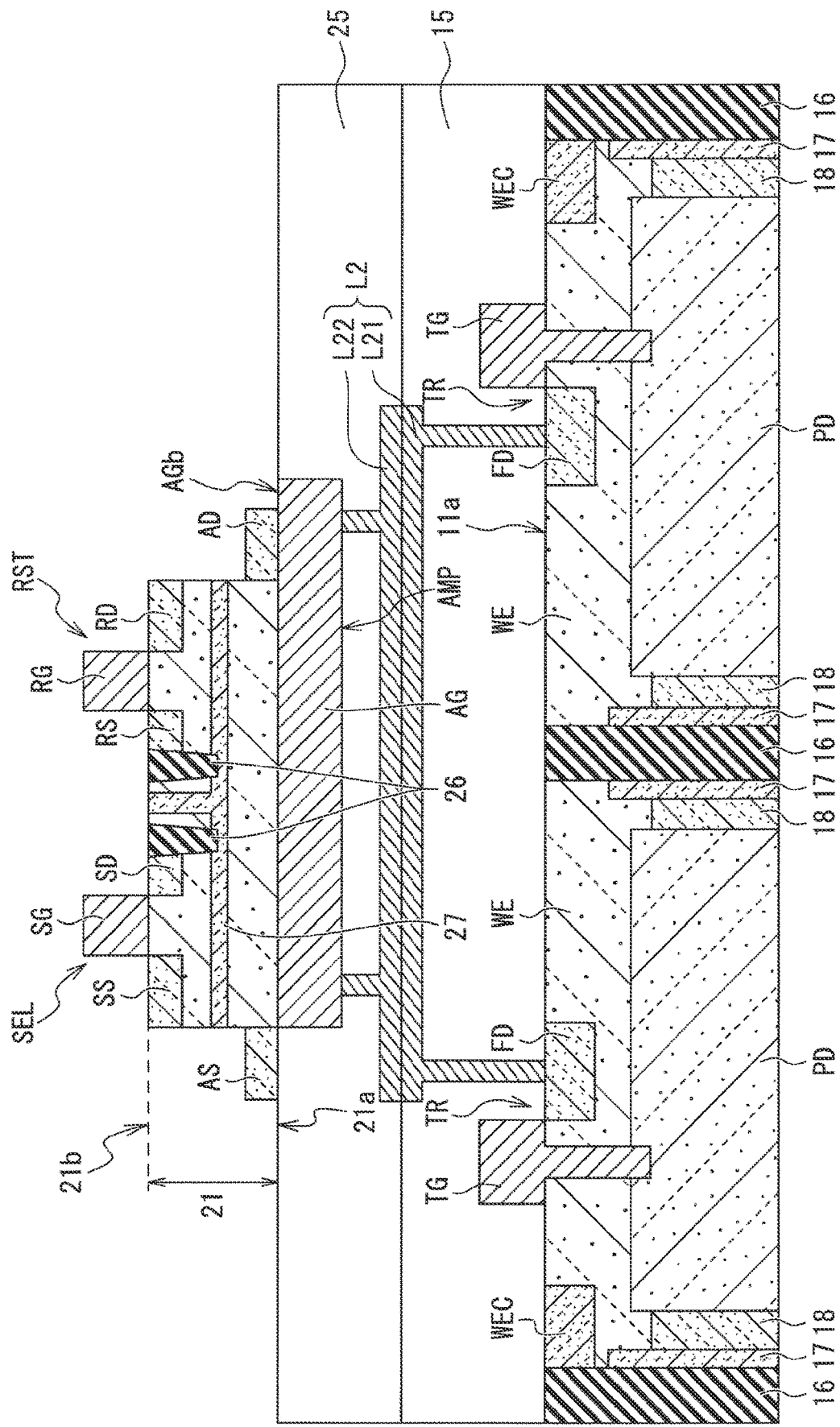
FIG. 17 depicts a cross-sectional diagram illustrating the method of manufacturing the imaging device according to the second embodiment of the present disclosure.

The subsequent processes are the same as those in the first embodiment. Next, as depicted in FIG. 16, the manufacturing equipment forms, through CMOS processes, in the rear surface 21b (the upper surface in FIG. 16) of the second semiconductor substrate 21, the element isolation layers 26, the well layers 27, the selection transistors SEL, and the reset transistors RST. Next, as depicted in FIG. 17, the manufacturing equipment partially removes the second semiconductor substrate 21, thereby exposing the source AS, drain AD, and gate electrode AG of the amplification transistor AMP. Then, the manufacturing equipment forms the wiring L1, and L3 to L10 depicted in FIG. 12 and the remaining part (for example, the part upper than the position sec21) of the second wiring part L22. This completes the imaging device 1A.

According to the imaging device 1A according to the second embodiment of the present disclosure, as in the case of the imaging device 1 according to the first embodiment, it is possible to increase the area of a disposition region allocated for the transistors included in the readout circuit 22. This results in an increase in the degree of freedom in layout of the readout circuit 22. For example, the configuration may be such that the amplification transistor AMP is disposed in the front surface 21a of the second semiconductor substrate 21 and such that the selection transistor SEL and the reset transistor RST are disposed in the rear surface 21b. This allows the area of the amplification transistor AMP to be maximized, resulting in a further reduction in random noise.

Moreover, in the imaging device 1A, the wirings L2 are coupled to the front surface AGa of the gate electrode AG of the amplification transistor AMP. With this configuration, compared to the case in which the wirings L2 are coupled to the rear surface AGb of the gate electrode AG, it is possible to reduce the number of the wirings L2 that pass through the side of the second semiconductor substrate 21. For example, such a reduction in the number of the wirings L2 passing through the side of the second semiconductor substrate 21 allows proportionately the pixel unit PU to be downsized or, alternatively, the second semiconductor substrate 21 included in the pixel unit PU to be expanded in the horizontal direction. In addition, in the wirings L2, it is possible to reduce the wiring length between the floating diffusions FD and the gate electrodes AG, which allows a reduction in parasitic capacitance. In such a way, the imaging device 1A may contribute to achieving higher fineness and higher performance of pixel units PU.

Other Embodiments

As described above, although the present disclosure has been described in the form of specific embodiments and variations, it is not to be understood that the descriptions and drawings that constitute parts of the disclosure limit the present disclosure. It is to be understood that various alternative embodiments, examples, and operable techniques will become apparent from the disclosure to those skilled in the art.

For example, in the first and second embodiments described above, the descriptions have been made regarding the configuration in which the amplification transistor AMP is disposed in the front surface 21a of the second semiconductor substrate 21 and the selection transistor SEL and the reset transistor RST are disposed in the rear surface 21b. However, the embodiment of the present disclosure is not limited to this. The selection transistor SEL and the reset transistor RST may be disposed in the front surface 21a of the second semiconductor substrate 21 and the amplification transistor AMP may be disposed in the rear surface 21b. Alternatively, the amplification transistor AMP and one of the selection transistor SEL and the reset transistor RST may be disposed in the front surface 21a and the other of the selection transistor SEL and the reset transistor RST may be disposed in the rear surface 21b.

In such a way, it is obvious that the present technology includes various embodiments not described herein. At least one of various omissions, substitutions and modifications of the components may be made without departing from the gist of the embodiments and variations described above. Further, the advantageous effects described in the present specification are merely examples and are not intended to be limited, and other advantageous effects may be obtained.

It is to be noted that the present disclosure may also include the following configurations.

(1)

An imaging device, including:

a first semiconductor substrate including a sensor pixel configured to perform photoelectric conversion; and a second semiconductor substrate including a readout circuit configured to output a pixel signal according to an electric charge output from the sensor pixel, in which the second semiconductor substrate is laminated on a one surface side of the first semiconductor substrate so as to configure a laminated body, the second semiconductor substrate includes a first surface facing the first semiconductor substrate and a second surface located opposite to the first surface, the first transistor included in the readout circuit is disposed in the first surface, and the second transistor included in the readout circuit is disposed in the second surface.

(2)

The imaging device according to (1), in which, in a thickness direction of the laminated body, the first transistor and the second transistor are overlaid with each other.

(3)

The imaging device according to (1) or (2), in which the sensor pixel includes a photoelectric conversion element, a transfer transistor electrically coupled to the photoelectric conversion element, and a floating diffusion configured to temporally hold an electric charge output from the photoelectric conversion element via the transfer transistor, the readout circuit includes a reset transistor configured to reset an electric potential of the floating diffusion to a predetermined electric potential, an amplification transistor configured to generate a voltage signal, as the pixel signal, according to a level of the electric charge held in the floating diffusion, and a selection transistor configured to control an output timing of the pixel signal output from the amplification transistor, the first transistor is one transistor selected from the reset transistor, the amplification transistor, and the selection transistor, and the second transistor is the other transistors, excluding the one transistor from among the reset transistor, the amplification transistor, and the selection transistor.

(4)

The imaging device according to (3), in which the one transistor includes the amplification transistor, and the other transistors include the reset transistor and the selection transistor.

(5)

The imaging device according to (4), in which a plurality of the sensor pixels is electrically coupled to the one readout circuit, to constitute one pixel unit, and the amplification transistor is located at a center portion of the pixel unit in a plan view from a thickness direction of the laminated body.

(6)

The imaging device according to (4) or (5), in which the laminated body includes a wiring group electrically coupled to the sensor pixel, and at least a part of the wiring group is disposed to have bilateral symmetry with the amplification transistor being interposed in a plan view from a thickness direction of the laminated body.

(7)

The imaging device according to (6), in which the wiring group includes a first wiring coupled to a gate electrode of the transfer transistor, and the first wiring is disposed to have bilateral symmetry with the amplification transistor being interposed.

(8)

The imaging device according to any one of (4) to (7), in which the laminated body includes a second wiring coupled to a surface of a gate electrode of the amplification transistor, the surface facing the first semiconductor substrate.

REFERENCE SIGNS LIST 1, 1A: Imaging device
3: Column-signal processing circuit
10: First substrate
10a, 11a, 21a: Front surface
11: First semiconductor substrate
12: Sensor pixel
13: Pixel region
15, 25: Insulating film
16, 26: Element isolation layer
17: p-type layer
18: n-type layer
20: Second substrate
21: Second semiconductor substrate
21b: Rear surface
22: Readout circuit
23: Pixel drive line
24: Vertical signal line 27: Well layer
30: Third substrate
31: Third semiconductor substrate
32: Logic circuit
33: Vertical drive circuit
34: Column-signal processing circuit
35: Horizontal drive circuit
36: System control circuit
51: Interlayer insulating film
AD, RD, SD: Drain
AG, RG, SG, TG: Gate electrode
AGa: Front surface
AGb: Rear surface
AMP: Amplification transistor
AS, RS, SS: Source
FD: Floating diffusion
L1, L2, L3, L4, L5, L6, L7, L8, L9, L10: Wiring
L21: First wiring part
L22: Second wiring part
PD: Photodiode
PU: Pixel unit
RST: Reset transistor
sec1, sec2, sec3, sec21, sec22: Position
SEL: Selection transistor
TR: Transfer transistor
VDD: Power source line
WE: Well layer
WEC: Well contact layer

What is claimed is:

1. An imaging device, comprising:
a first semiconductor substrate including a sensor pixel configured to perform photoelectric conversion; and
a second semiconductor substrate including a readout circuit configured to output a pixel signal according to an electric charge output from the sensor pixel,
wherein the second semiconductor substrate is laminated on a one surface side of the first semiconductor substrate so as to configure a laminated body,
wherein the second semiconductor substrate includes a first surface facing the first semiconductor substrate and a second surface located opposite to the first surface,
wherein a first transistor included in the readout circuit is disposed in the first surface,
wherein a second transistor included in the readout circuit is disposed in the second surface, and
wherein in a thickness direction of the laminated body, at least a part of the first transistor and at least a part of the second transistor are overlaid with each other.

2. The imaging device according to claim 1, wherein the sensor pixel includes:
a photoelectric conversion element;
a transfer transistor electrically coupled to the photoelectric conversion element; and
a floating diffusion configured to temporally hold an electric charge output from the photoelectric conversion element via the transfer transistor,
wherein the readout circuit includes:
a reset transistor configured to reset an electric potential of the floating diffusion to a predetermined electric potential;
an amplification transistor configured to generate a voltage signal, as the pixel signal, according to a level of the electric charge held in the floating diffusion; and
a selection transistor configured to control an output timing of the pixel signal output from the amplification transistor,
wherein the first transistor is one transistor selected from the reset transistor, the amplification transistor, and the selection transistor, and
wherein the second transistor is the other transistors, excluding the one transistor from among the reset transistor, the amplification transistor, and the selection transistor.

3. The imaging device according to claim 2, wherein the one transistor includes the amplification transistor, and the other transistors include the reset transistor and the selection transistor.

4. The imaging device according to claim 3, wherein a plurality of the sensor pixels is electrically coupled to the one readout circuit, to constitute one pixel unit, and the amplification transistor is located at a center portion of the pixel unit in a plan view from a thickness direction of the laminated body.

5. The imaging device according to claim 3, wherein the laminated body includes:
a wiring group electrically coupled to the sensor pixel; and
at least a part of the wiring group is disposed to have bilateral symmetry with the amplification transistor being interposed in a plan view from a thickness direction of the laminated body.

6. The imaging device according to claim 5, wherein the wiring group includes a first wiring coupled to a gate electrode of the transfer transistor, and the first wiring is disposed to have bilateral symmetry with the amplification transistor being interposed.

7. The imaging device according to claim 3, wherein the laminated body includes a second wiring coupled to a surface of a gate electrode of the amplification transistor, the surface of the gate electrode of the amplification transistor facing the first semiconductor substrate.

8. The imaging device according to claim 4, wherein the plurality of the sensor pixels equals four.

9. The imaging device according to claim 7, wherein the floating diffusion is coupled to a rear surface side of the gate electrode of the amplification transistor.

10. The imaging device according to claim 7, wherein the floating diffusion is coupled to a front surface side of the gate electrode of the amplification transistor.

11. A method of manufacturing an imaging device, comprising:
forming a first semiconductor substrate including a sensor pixel configured to perform photoelectric conversion;
forming a second semiconductor substrate including a readout circuit configured to output a pixel signal according to an electric charge output from the sensor pixel;
laminating the second semiconductor substrate on a one surface side of the first semiconductor substrate so as to configure a laminated body;
forming the second semiconductor substrate to include a first surface facing the first semiconductor substrate and a second surface located opposite to the first surface;
forming a first transistor included in the readout circuit disposed in the first surface;
forming a second transistor included in the readout circuit disposed in the second surface; and
overlaying at least a part of the first transistor and at least a part of the second transistor with each other in a thickness direction of the laminated body.

12. The method according to claim 11, wherein the sensor pixel includes:
a photoelectric conversion element;

a transfer transistor electrically coupled to the photoelectric conversion element; and a floating diffusion configured to temporally hold an electric charge output from the photoelectric conversion element via the transfer transistor, wherein the readout circuit includes:

a reset transistor configured to reset an electric potential of the floating diffusion to a predetermined electric potential;

an amplification transistor configured to generate a voltage signal, as the pixel signal, according to a level of the electric charge held in the floating diffusion; and a selection transistor configured to control an output timing of the pixel signal output from the amplification transistor, wherein the first transistor is one transistor selected from the reset transistor, the amplification transistor, and the selection transistor, and wherein the second transistor is the other transistors, excluding the one transistor from among the reset transistor, the amplification transistor, and the selection transistor.

13. The method according to claim 12, wherein the one transistor includes the amplification transistor, and the other transistors include the reset transistor and the selection transistor.

14. The method according to claim 13, further comprising:

electrically coupling a plurality of the sensor pixels to the readout circuit, to constitute one pixel unit; and locating the amplification transistor at a center portion of the pixel unit in a plan view from a thickness direction of the laminated body.

15. The method according to claim 13, wherein the laminated body includes:

a wiring group electrically coupled to the sensor pixel; and at least a part of the wiring group is disposed to have bilateral symmetry with the amplification transistor being interposed in a plan view from a thickness direction of the laminated body.

16. The method according to claim 15, further comprising coupling a first wiring to a gate electrode of the transfer transistor in the wiring group, wherein the first wiring is disposed to have bilateral symmetry with the amplification transistor being interposed.

17. The method according to claim 13, further comprising coupling a second wiring to a surface of a gate electrode of the amplification transistor in the laminated body, wherein the surface of the gate electrode of the amplification transistor faces the first semiconductor substrate.

18. The method according to claim 14, wherein the plurality of the sensor pixels equals four.

19. The method according to claim 17, further comprising coupling the floating diffusion to a rear surface side of the gate electrode of the amplification transistor.

20. The method according to claim 17, further comprising coupling the floating diffusion to a front surface side of the gate electrode of the amplification transistor.

* * * * *